United States Patent
Sugiyama et al.

(10) Patent No.: US 6,560,763 B1
(45) Date of Patent: May 6, 2003

(54) ROUTE SEARCHING METHOD AND STORAGE MEDIUM

(75) Inventors: Hiroyuki Sugiyama, Kawasaki (JP); Yasunori Abe, Kawasaki (JP); Naomi Bizen, Kawasaki (JP); Hiroshi Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/637,642

(22) Filed: Aug. 14, 2000

(30) Foreign Application Priority Data

Nov. 10, 1999 (JP) .............................. 11-320219

(51) Int. Cl.[7] .............................................. G06F 17/50
(52) U.S. Cl. .......................................... 716/13; 716/12
(58) Field of Search ................................. 716/13, 1–18

(56) References Cited

U.S. PATENT DOCUMENTS

| | | | | |
|---|---|---|---|---|
| 5,245,550 A | * | 9/1993 | Miki et al. ..................... 716/13 |
| 5,390,346 A | * | 2/1995 | Marz ........................... 455/260 |
| 5,398,262 A | * | 3/1995 | Ahuja .......................... 375/356 |
| 5,452,228 A | * | 9/1995 | Arakawa et al. ................ 716/6 |
| 5,574,756 A | * | 11/1996 | Jeong .......................... 375/376 |
| 5,608,645 A | * | 3/1997 | Spyrou .......................... 716/6 |

* cited by examiner

Primary Examiner—Vuthe Siek
Assistant Examiner—Sun James Lin
(74) Attorney, Agent, or Firm—Staas & Halsey LLP

(57) ABSTRACT

A route searching method is used for circuit design, and includes a step of setting, with respect to each pin, a corresponding flag of a pass flag which indicates that a pin is passed, a searching flag which indicates that a pin is being searched, and a branch flag which indicates that a pin is a branch point, and a step of determining a direction of a route search depending on each flag which is set with respect to each pin.

21 Claims, 22 Drawing Sheets

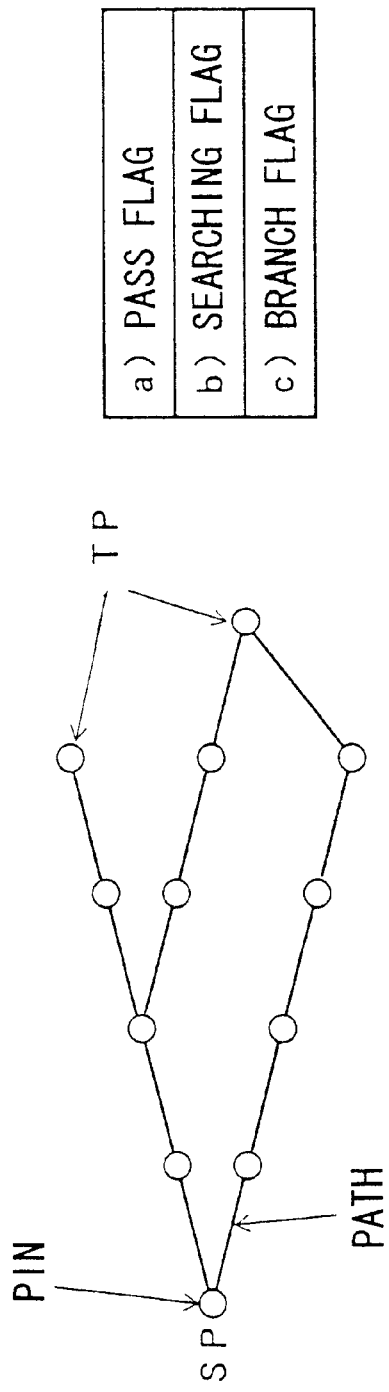

FIG. 16

| ROUTE FROM S TO T1 | ROUTE FROM S TO T2 | BRANCH POINT |
|---|---|---|
| ROUTE 1 | ROUTE 7 | D |
| ROUTE 1 | ROUTE 8 | D |
| ROUTE 1 | ROUTE 9 | D |
| ROUTE 2 | ROUTE 7 | J |
| ROUTE 2 | ROUTE 8 | J |
| ROUTE 2 | ROUTE 9 | J |
| ROUTE 3 | ROUTE 7 | D |
| ROUTE 3 | ROUTE 8 | D |
| ROUTE 3 | ROUTE 9 | D |
| ROUTE 4 | ROUTE 7 | J |
| ROUTE 4 | ROUTE 8 | J |
| ROUTE 4 | ROUTE 9 | J |
| ROUTE 5 | ROUTE 7 | D |
| ROUTE 5 | ROUTE 8 | D |
| ROUTE 5 | ROUTE 9 | D |
| ROUTE 6 | ROUTE 7 | J |
| ROUTE 6 | ROUTE 8 | J |
| ROUTE 6 | ROUTE 9 | J |

ROUTE SEARCHING METHOD AND STORAGE MEDIUM

BACKGROUND OF THE INVENTION

This application claims the benefit of a Japanese Patent Application No.11-320219 filed Nov. 10, 1999, in the Japanese Patent Office, the disclosure of which is hereby incorporated by reference.

1. Field of the Invention

The present invention generally relates to route searching methods and storage media, and more particularly to a route searching method for analyzing timings and delay times of paths which include circuit elements, wirings and the like and through which signals propagate when designing circuits such as LSIs, and to a computer-readable storage medium which stores a program for causing a computer to carry out such a route search process.

2. Description of the Related Art

Route searching methods make a timing analysis, to analyze the timings and the delay times of the paths which include circuit elements, wirings and the like and through which the signals propagate, when designing circuits such as LSIs. Such route searching methods can be categorized into a worst route search and a total route search. In a case where a plurality of paths join, the worst route search propagates, as a route search result, only a calculation result with respect to a worst route. On the other hand, in the case where a plurality of paths join, the total route search propagates, as the route search result, the calculation results with respect to all of the routes.

In addition, in a case where no route search is made, a route is checked every time a calculation is made with respect to the route. When checking the route, a plurality of routes may pass through the same pin depending on the routes, and in this case, the analyzing time of the timing analysis becomes that much longer because calculation conditions are judged a plurality of times with respect to the same pin.

According to the conventional route searching method, the amount of calculations which are made is large because the calculations with respect to the routes are basically made while searching the routes. In addition, the same calculation may be made a plurality of times depending on the routes. As a result, there are problems in that it is difficult to increase the speed of the calculation process in the conventional route searching method, and that a high-speed timing analysis cannot be made by the conventional route searching method.

SUMMARY OF THE INVENTION

Accordingly, it is a general object of the present invention to provide a novel and useful route searching method and storage medium, in which the problems described above are eliminated.

Another and more specific object of the present invention is to provide a route searching method and a storage medium, which can reduce the amount of calculations which are made with respect to the routes regardless of the routes, and can carry out the calculation process at a high speed, so that a high-speed timing analysis can be made.

Still another object of the present invention is to provide a a route searching method used for circuit design, comprising the steps of (a) setting, with respect to each pin, a corresponding flag of a pass flag which indicates that a pin is passed, a searching flag which indicates that a pin is being searched, and a branch flag which indicates that a pin is a branch point, and (b) determining a direction of a route search depending on each flag which is set with respect to each pin. According to the route searching method of the present invention, it is possible to reduce the amount of calculations which are made with respect to the routes regardless of the routes, and to carry out the calculation process at a high speed, so that a high-speed timing analysis can be made.

A further object of the present invention is to provide a computer-readable storage medium which stores a program for causing a computer to carry out a route search for use in circuit design, wherein the program comprises a flag set procedure causing the computer to set, with respect to each pin, a corresponding flag of a pass flag which indicates that a pin is passed, a searching flag which indicates that a pin is being searched, and a branch flag which indicates that a pin is a branch point, and a determining procedure causing the computer to determine a direction of a route search depending on each flag which is set with respect to each pin. According to the computer-readable storage medium of the present invention, it is posisble to reduce the amount of calculations which are made with respect to the routes regardless of the routes, and to carry out the calculation process at a high speed, so that a high-speed timing analysis can be made.

Other objects and further features of the present invention will be apparent from the following detailed description when read in conjunction with the accompanying drawings.

BRIEF DESCRIPTION OF THE DRAWINGS

FIG. 5 is a diagram for explaining a route searched by the process shown in FIG. 3;

FIG. 16 is a diagram showing clock skews and branch points obtained for combinations of all routes from a starting point to termination points;

DESCRIPTION OF THE PREFERRED EMBODIMENTS

Figure 1:
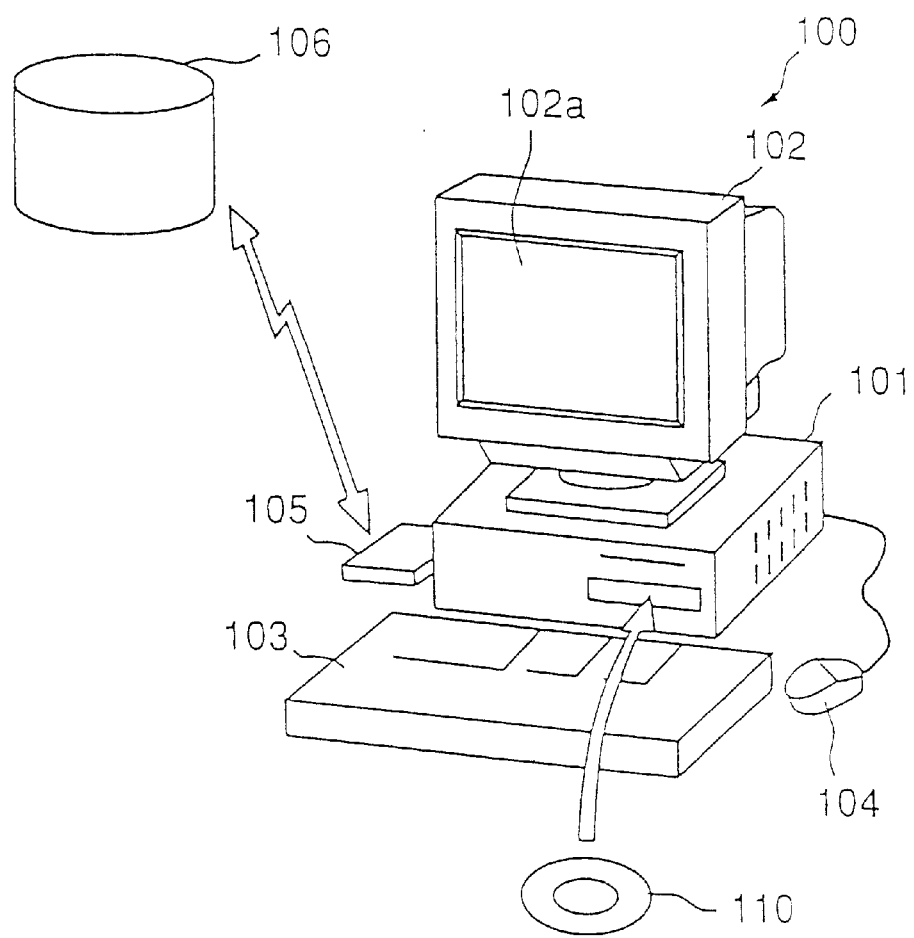
FIG. 1 is a perspective view showing a computer system capable of realizing a route searching method according to the present invention.

A description will be given of various embodiments of a route searching method according to the present invention and a computer-readable storage medium according to the present invention, by referring to the drawings.

FIG. 1 is a perspective view showing a computer system capable of realizing a route searching method according to the present invention.

A computer system 100 shown in FIG. 1 generally includes a main body 101 which includes a CPU, a disk drive and the like, a display 102 which displays an image on a display screen 102a in response to an instruction from the main body 101, a keyboard 103 or inputting various information to the computer system 100, a mouse 104 for specifying an arbitrary position on the display screen 102a of the display 102, and a modem 105 which makes access to an external database or the like and downloads a program and the like stored in another computer system.

A program (Computer-Aided-Design (CAD) software) for causing the computer system 100 to have a route searching function, is stored in a portable recording medium such as a disk 110 or, is downloaded from a recording medium 106 of another computer system using a communication unit such as the modem 105. This program is input to the computer system 100 and is compiled therein. A computer-readable storage medium according to the present invention is formed by a recording medium such as the disk 110 which stores the program described above. The recording medium forming the computer-readable storage medium according to the present invention is not limited to portable recording media such as the disk 110, IC card memories, floppy disks, magneto-optical disks, CD-ROMs, but also includes various kinds of recording media which are accessible by a computer system which is connected via a communication means or communication unit such as the modem 105 and the LAN.

Figure 2:
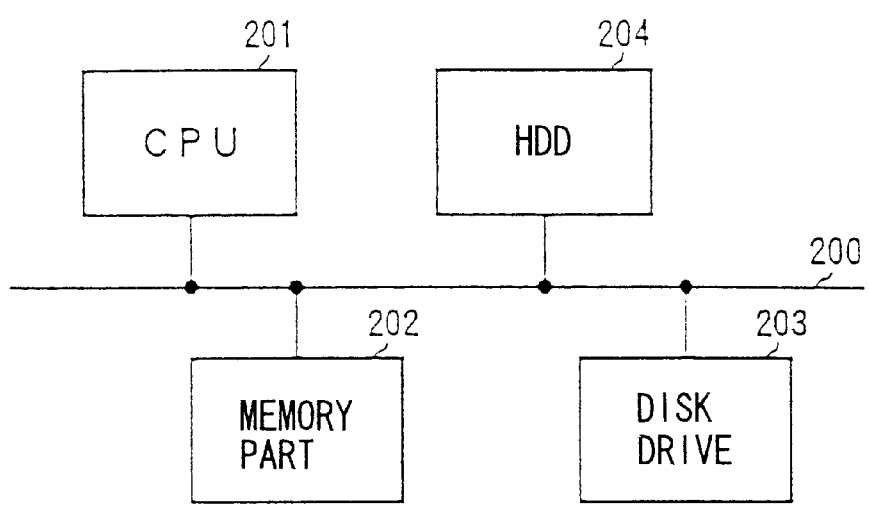
FIG. 2 is a system block diagram showing the construction of an important part within a main body of the computer system.

FIG. 2 is a system block diagram for explaining the construction of an important part within the main body 101 of the computer system 100. In FIG. 2, the main body 101 generally includes a CPU 201, a memory part 202 including a RAM, a ROM and the like, a disk drive 203 for the disk 110, and a hard disk drive (HDD) 204 which are connected via a bus 200. For example, the disk drive 203 may be made up of a floppy disk drive unit for the floppy disk, and a CD-ROM drive unit for the CD-ROM. The display 102, the keyboard 103, the mouse 104 and the like may be connected to the CPU 201 via the bus 200, or directly connected to the CPU 201.

The construction of the computer system 100 is of course not limited to that shown in FIGS. 1 and 2, and various other constructions may be employed. In addition, although the computer system 100 is a desk-top type system, the present invention may be applied to a portable type computer system.

Figure 3:
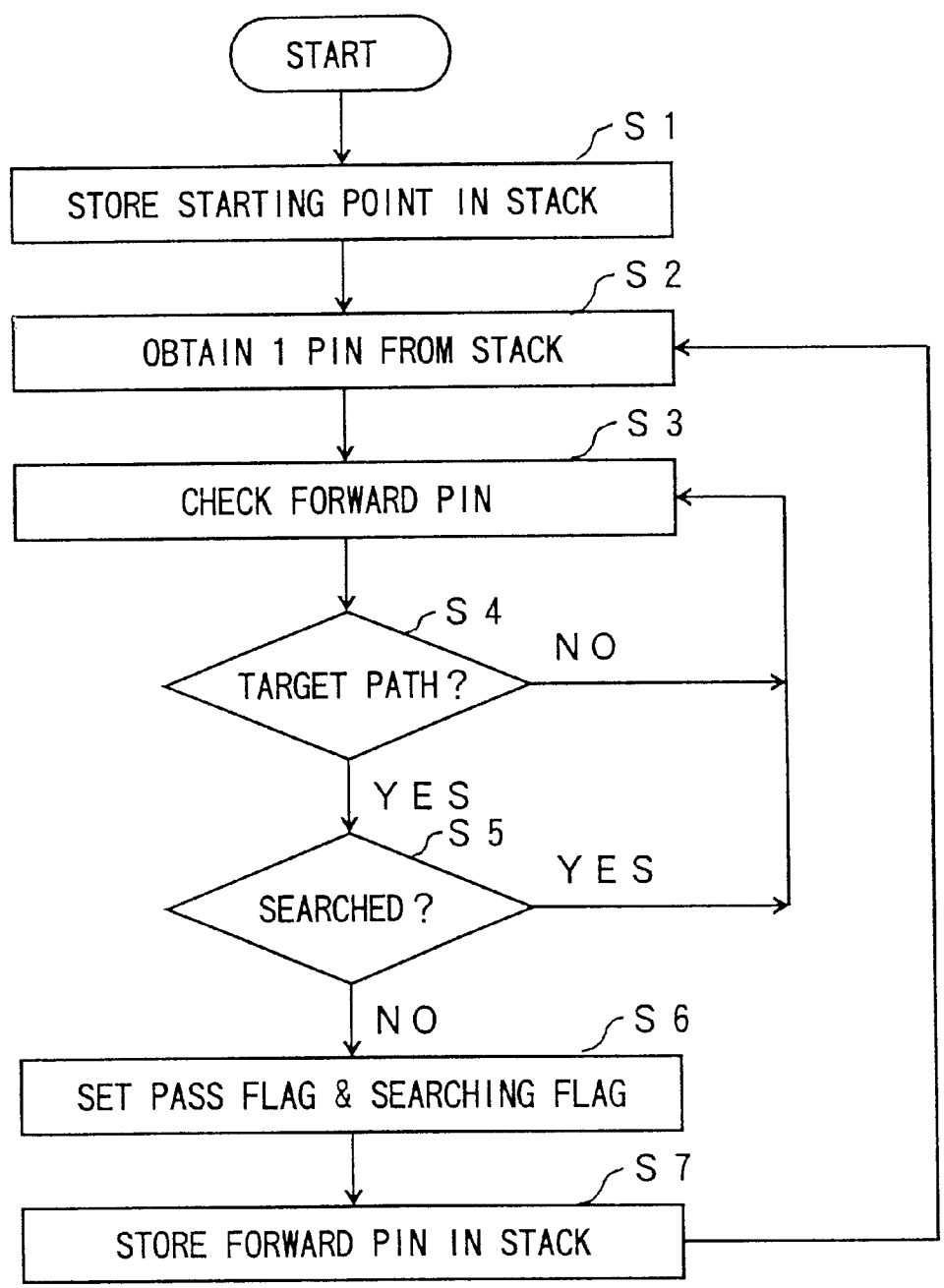
FIG. 3 is a flow chart for explaining the route search process by a first embodiment of the route searching method according to the present invention.

First, a description will be given of the route search process of the computer system 100 by a first embodiment of the route searching method according to the present invention. FIG. 3 is a flow chart for explaining the route search process of the CPU 201 of the computer system 100 when employing the first embodiment of the route searching method. The process shown in FIG. 3 corresponds to the program which is stored in a first embodiment of the storage medium according to the present invention.

Figure 4B:
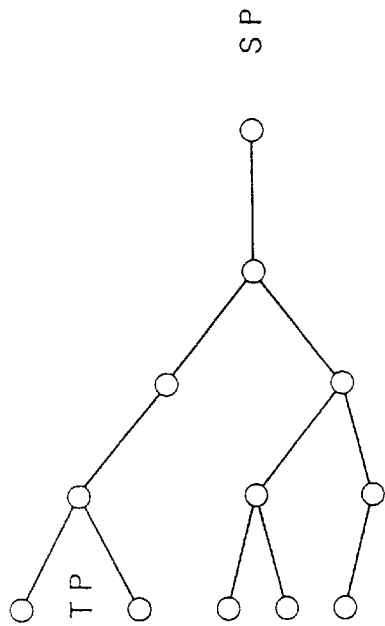
FIGS. 4A, 4B and 4C are diagrams for explaining three kinds of route searches.
Figure 4A:
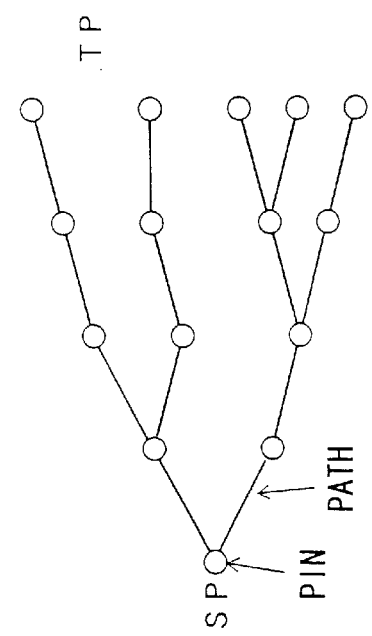
Figure 4C:
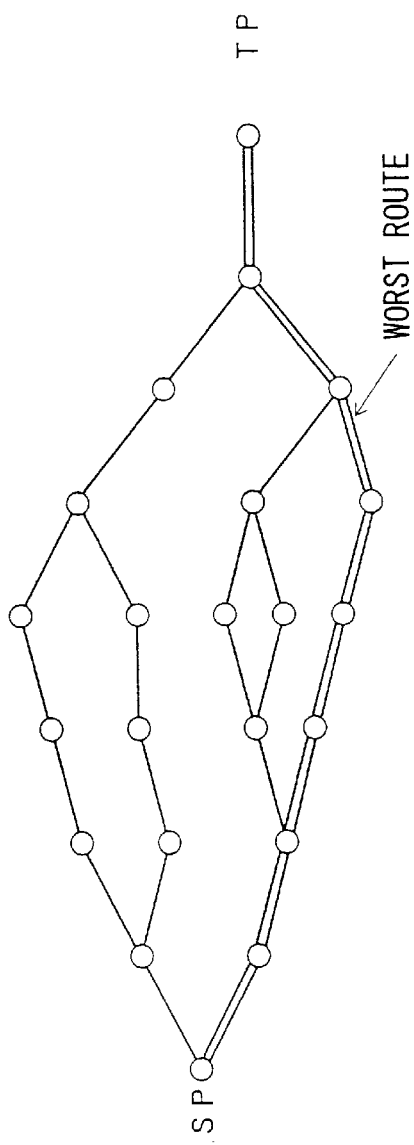

FIGS. 4A, 4B and 4C are diagrams for explaining three kinds of route searches. FIG. 4A shows a forward route search from an arbitrary starting point SP to a termination point TP. FIG. 4B shows a backward route search from a starting point SP to an arbitrary termination point TP. FIG. 4C shows a point-to-point route search, that is, a route search between two points, from a starting point SP to a termination point TP. In FIGS. 4A through 4C, a symbol "603" indicates a point, and a line connecting two pins indicates a path which includes wirings, circuit elements and the like and through which signals propagate. In addition, a double line in FIG. 4C indicates a worst route.

In this embodiment, when the termination point TP is recognized, a backward route search is carried out from the termination point TP before carrying out a forward route search. Then, when the starting point SP is specified, the forward route search is carried out from the starting point SP, and a judgement is made to determine whether or not to advance to a forward route, with respect to each pin, while carrying out the route search. No forward route search is carried out if a target pin satisfies one of the following conditions (a) through (c).

Condition (a): The target pin has an attribute for stopping the route search.

Condition (b): A route search with respect to the target pin has already been carried out.

Condition (c): The target pin is not located in a passing route of a backward route search which is previously carried out.

Hence, by making a path analysis only with respect to a route which is obtained by the search, it is possible to reduce the number of paths to be analyzed, and accordingly enable a high-speed timing analysis.

In FIG. 3, a step S1 stores the starting point SP in a stack within the memory part 202, for example, and a step S2 obtains one pin from the stack. A step S3 carries out a forward route search from the obtained pin, and checks a pin in the forward direction. A step S4 decides whether or not a path from the obtained pin to the pin in the forward direction is a path which is a target of the route search. The process returns to the step S3 if the decision result in the step S4 is NO. On the other hand, if the decision result in the step S4 is YES, a step S5 decides whether or not the path has already been searched. The process returns to the step S3 if the decision result in the step S5 is YES.

If the decision result in the step S5 is NO, a step S6 sets a corresponding flag, from a pass flag "a", a searching flag "b" and a branch flag "c", with respect to the obtained pin. In addition, a step S7 stores the pin in the forward direction in the stack, and the process returns to the step S2, so as to repeat similar processes.

FIGS. 5 through 9 are diagrams for explaining the route searched by the process shown in FIG. 3. In FIGS. 5 through 9, those parts which are the same as those corresponding parts in FIG. 4 are designated by the same reference numerals, and a description thereof will be omitted. In addition, in FIGS. 5 through 9, a symbol "●" indicates a pin which is already searched, a bold line indicates a path which is already searched, and an arrow indicates a direction of the route search.

When carrying out the route search with respect to a pin/path arrangement shown in FIG. 5, a region in which the pass flag "a", the searching flag "b" and the branch flag "c" can be set is prepared in a route search process table. This route search process table is provided for each pin, and is provided within the memory part 202, for example. The pass flag "a" is set when the target pin is searched and is passed on the search route which is searched. The searching flag "b" is set when the target pin is being searched. The branch flag "c" is set when a plurality of paths exist in the forward direction from the target pin, that is, when a branch exists in the forward direction from the target pin. When the branch flag "c" is set, an arbitrary one of the plurality of paths is selected and searched.

Figure 6:
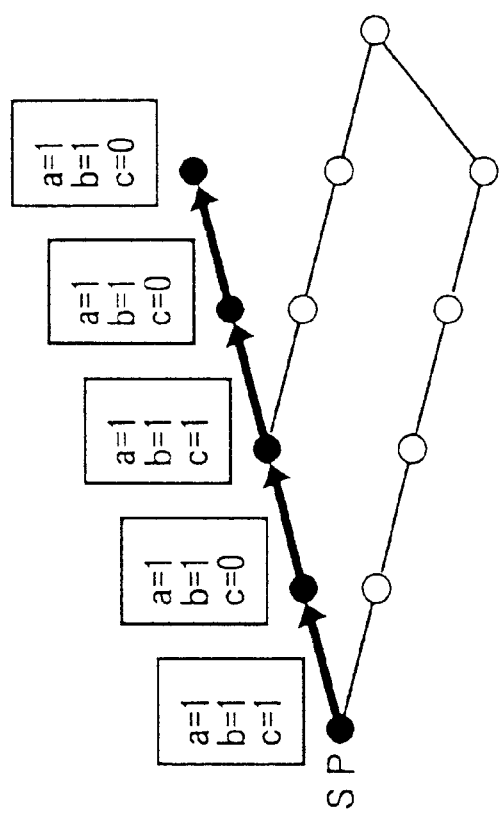
FIG. 6 is a diagram for explaining the route searched by the process shown in FIG. 3.

Accordingly, when the route search is started from the starting point SP shown in FIG. 5, the route search progresses in the forward direction as shown in FIG. 6, and the pass flag "a", the searching flag "b" and the branch flag "c" with respect to each pin are set as indicated above each pin. It is assumed for the sake of convenience that each flag has a value "1" when set, and has a value "0" when reset.

Figure 7:
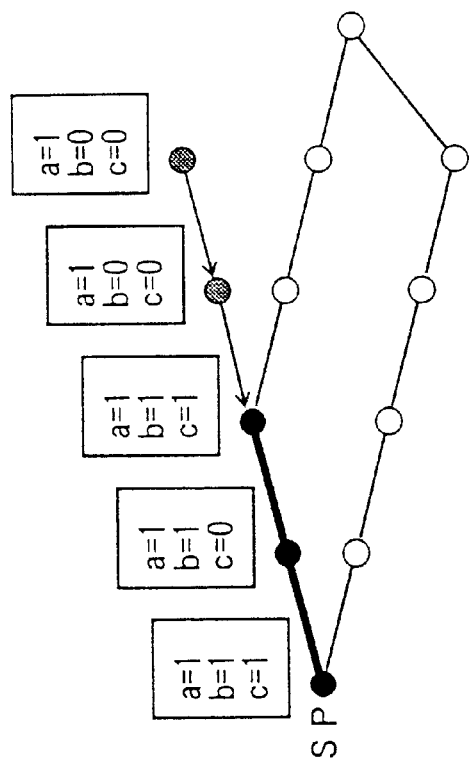
FIG. 7 is a diagram for explaining the route searched by the process shown in FIG. 3.

When no path exists in the forward direction from the target pin, the search is carried out in a backward direction with respect to the route which was searched in the forward direction until then, as shown in FIG. 7. When carrying out this search in the backward direction, the searching flag "b" of each pin which is passed is reset, as indicated above each passed pin.

Figure 8:
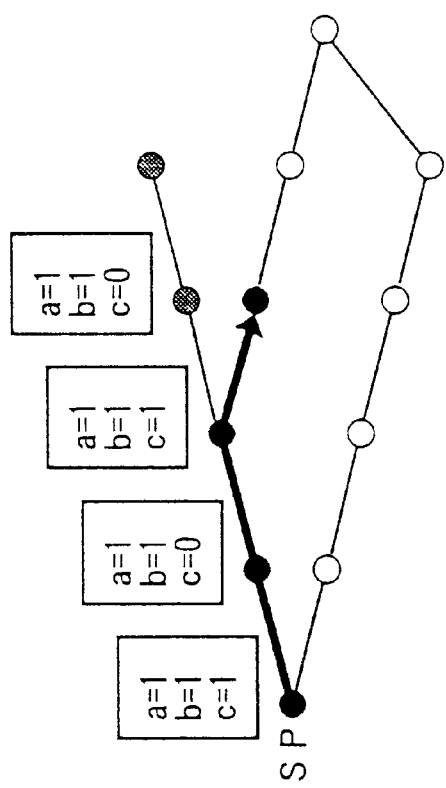
FIG. 8 is a diagram for explaining the route searched by the process shown in FIG. 3.

If a pin having the branch flag "c" which is set exists during the search in the backward direction, a path which has not been searched in the forward direction from this pin is selected as shown in FIG. 8, so as to carry out the search in the forward direction. In FIG. 8, the states of each of the flags are also shown above each pin.

Figure 9:
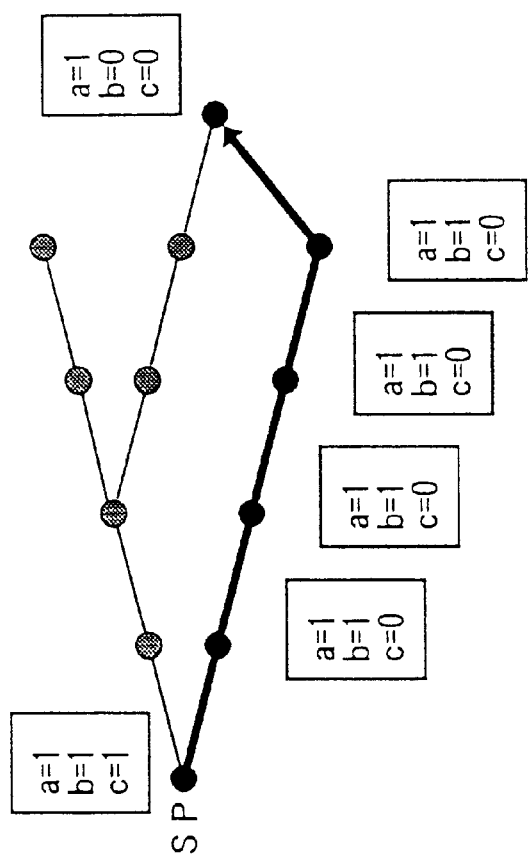
FIG. 9 is a diagram for explaining the route searched by the process shown in FIG. 3.

When the search is carried out in the forward direction and a pin having the pass flag "a" which is set is reached as shown in FIG. 9, the path beyond this pin has already been searched. Hence, the search returns to the pin having the branch flag "c" which is set as shown in FIG. 8, and if a further path which has not been searched exists in the forward direction, the search is carried out similarly as described above until the search returns to the starting point SP. In FIG. 9, the states of each of the flags are shown above or below each pin. In the case shown in FIG. 9, the starting point SP is the pin having the pass flag "a" which is set. A path which has not been searched does not exist in the forward direction from the pin having the branch flag "c" which is set. Furthermore, another pin having the branch flag "c" which is set does not exist. Thus, the route search process ends.

Therefore, this embodiment carries out the route search in advance, so as to specify the route before carrying out the calculation process. As a result, it is possible to carry out the calculation process at a high speed.

Figure 10:
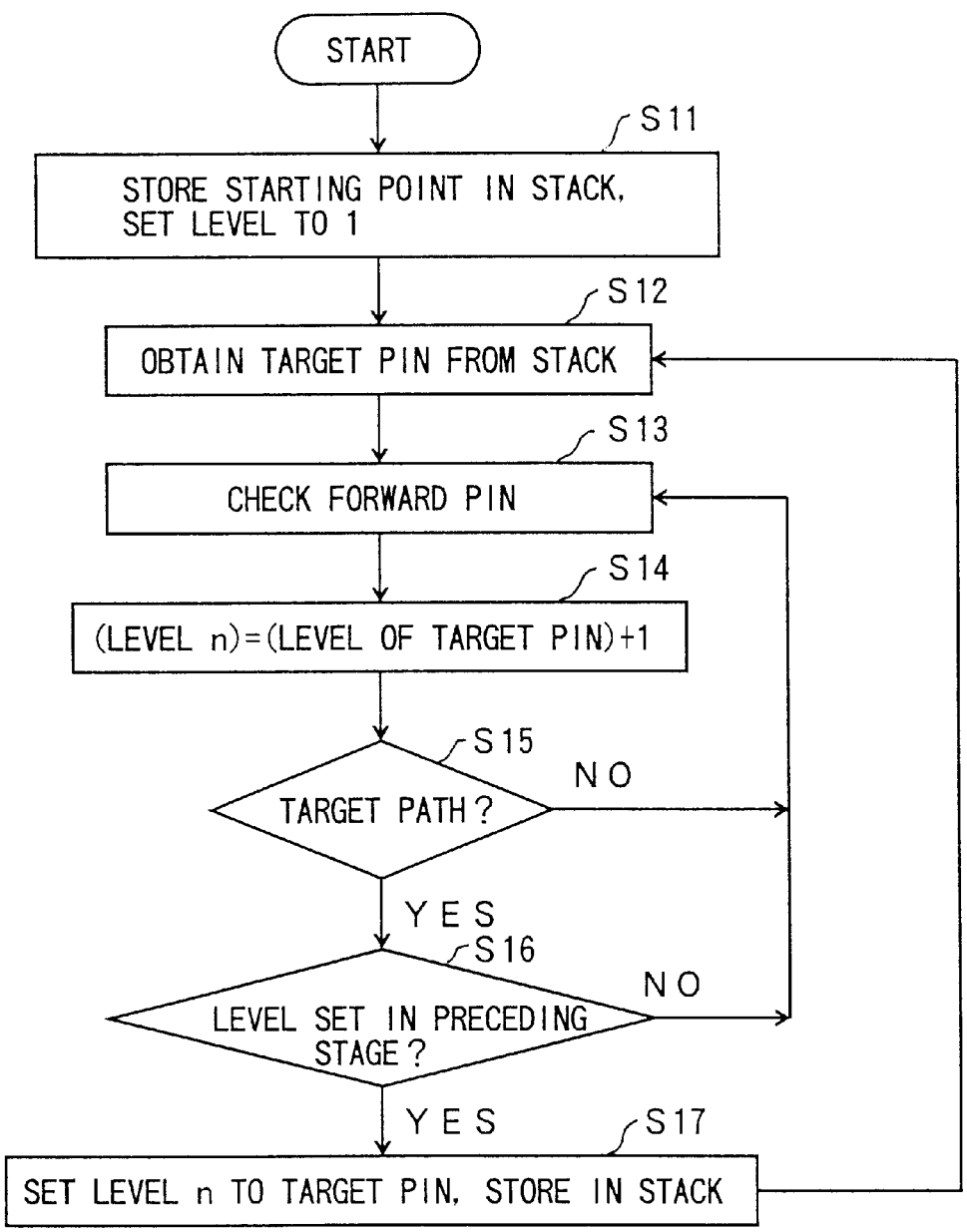
FIG. 10 is a flow chart for explaining the route search process by a second embodiment of the route searching method according to the present invention.

Next, a description will be given of an embodiment which sets a calculation level with respect to each pin, so that a high-speed condition judging process can be carried out when analyzing a path which is obtained in the above described manner. FIG. 10 is a flow chart for explaining the route search process of the CPU 201 of the computer system 100 when employing a second embodiment of the route searching method according to the present invention. The process shown in FIG. 10 corresponds to the program which is stored in a second embodiment of the storage medium according to the present invention.

The process shown in FIG. 10 carries out a route search again from the starting point SP, with respect to the route which is obtained by the first embodiment of the route searching method described above, and sets a calculation level with respect to each pin. In FIG. 10, a step S11 stores the starting point SP in the stack within the memory part 202, for example, and sets a calculation level of the starting point SP to "1". A step S12 obtains one pin from the stack. A step S13 carries out a forward route search from the obtained pin, and checks a pin in the forward direction. A step S14 increments a calculation level "n" of the obtained pin, that is, a target pin, by "1".

A step S15 decides whether or not a path from the obtained pin to a pin in the forward direction is a target path of the route search. The process returns to the step S13 if the decision result in the step S15 is NO. On the other hand, if the decision result in the step S15 is YES, a step S16 decides whether or not the calculation level is already set with respect to a pin at a stage preceding the path. The process returns to the step S13 if the decision result in the step S16 is NO. If the decision result in the step S16 is YES, a step S17 sets the calculation level "n" with respect to the target pin, stores the pin in the forward direction in the stack, and the process returns to the step S12 so as to repeat similar processes.

In other words, the calculation level of the pin is set so that the calculation level of the starting point SP is "1" and the calculation level increases by "1" for each pin as the route search progresses in the forward direction. In addition, in a case where a plurality of pins exist at the stage preceding the target pin, the calculation level of the target pin is set to a value which is "1" greater than a maximum value of the calculation levels of the group of pins existing at the stage preceding the target pin. For this reason, the route search process table which is provided for each pin, may be sorted in the ascending order of the calculation levels of the pins, and the order of the calculation processes can be determined based on the result of the sorting. If the calculation level of the target pin is "n", the calculation levels of the pins at the stage preceding the target pin are "n–1" or less, and thus, the calculation processes such as calculation of the delay time can be carried out from the pins having the lower calculation levels.

Therefore, even in the case where a plurality of pins exist at the stage preceding the target pin, this embodiment can carry out all calculation processes with respect to each of the pins at the preceding stage by carrying out the condition judging process only once with respect to the target pin. As a result, it is possible to reduce the number of times the condition judging process must be carried out, and accordingly carry out the calculation process at a high speed.

Figure 11:
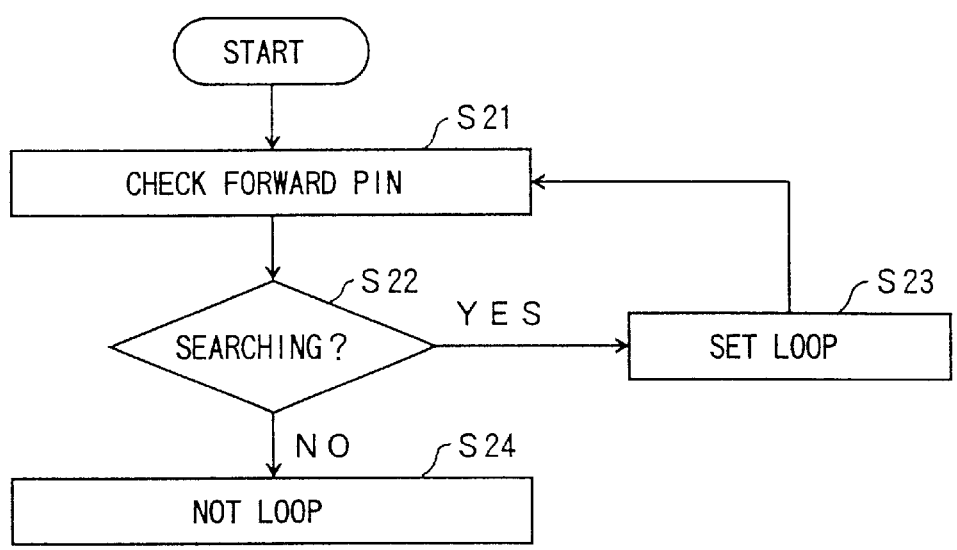
FIG. 11 is a flow chart for explaining the route search process by a third embodiment of the route searching method according to the present invention.

Next, a description will be given of an embodiment which can further increase the speed of the process of the second embodiment described above, by recognizing in advance pins in the path which form a loop, with respect to the route which is obtained in the above described manner. FIG. 11 is a flow chart for explaining the route search process of the CPU 201 of the computer system 100 when employing a third embodiment of the route searching method according to the present invention. The process shown in FIG. 11 corresponds to the program which is stored in a third embodiment of the storage medium according to the present invention.

The process shown in FIG. 11 is carried out with respect to the route which is obtained by the first embodiment described above. In FIG. 11, a step S21 carries out a forward route search from an obtained pin, and checks a pin in the forward direction. A step S22 decides whether or not the searching flag "b" is set with respect to the pin in the forward direction. If the decision result in the step S22 is YES and the pass flag "a" is also set with respect to the pin in the forward direction, a step S23 sets this pin in the forward direction as a loop pin LP, and the process returns to the step S21. On the other hand, if the decision result in the step S22 is NO, a step S24 judges that this pin in the forward direction is not a loop pin LP.

Figure 12:
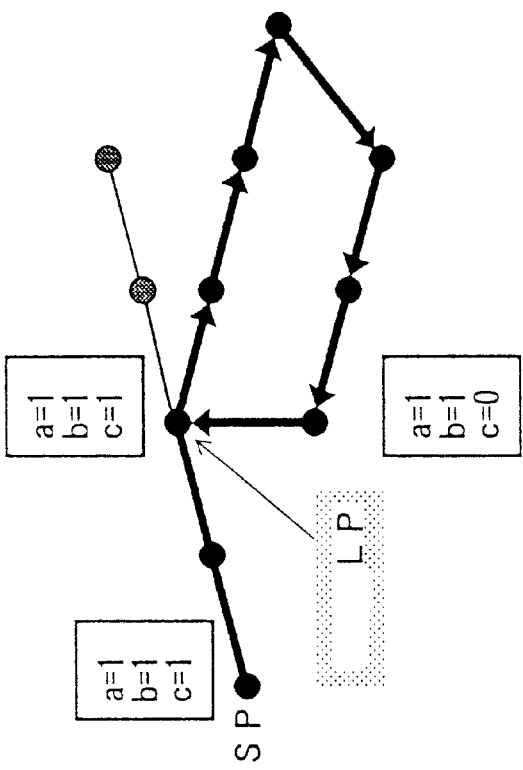
FIG. 12 is a diagram for explaining a route searched by the process shown in FIG. 11.

FIG. 12 is a diagram for explaining a route searched by the process shown in FIG. 11. In FIG. 12, those parts which are the same as those corresponding parts in FIGS. 5 through 9 are designated by the same reference numerals, and a description thereof will be omitted.

The loop of the route differs depending on the starting point of the route search. Hence, the recognition of the loop pin LP is made when carrying out the route search of the first embodiment described above. In FIG. 12, if the pass flag "a" and the searching flag "b" are simultaneously set with respect to a certain pin, a loop is formed by this certain pin. Accordingly, such a pin is recognized as the loop pin LP. When the search route which is searched reaches the loop pin LP, the route which has been searched is searched in the backward direction. During this search in the backward direction, a route which is searched until a pin having the branch flag "c" which is set is reached, becomes the route of the loop. If the search route from the target pin in the forward direction is a route of the loop, the route search is stopped at that point in time.

In other words, in a case where a pin which has already been passed is reached in the route during the search, this pin is recognized as the loop pin LP. In addition, during the route search, the calculation process with respect to the loop pin LP is carried out and the search is thereafter carried out in the forward direction if this loop pin LP is reached for the first time. If this loop pin LP is reached again, the calculation process is carried out with respect to this loop pin LP, and the route search is thereafter stopped.

Therefore, this embodiment detects the loop during the route search. For this reason, it is possible to recognize the loop when determining the order of the calculation processes in the second embodiment described above, and the calculation processes are that much more facilitated in this embodiment.

Therefore, according to the first through third embodiments described above, it is possible to increase the speed of the entire timing analysis. If the paths join at the target pin, the calculation process with respect to the target pin is carried out after all of the calculation processes with respect to the group of pins at the stage preceding the target pin are finished. Consequently, it is possible to minimize the number of calculations, and to carry out the entire timing analysis at a high speed.

Next, a description will be given of a fourth embodiment of the route searching method according to the present invention.

If routes of a clock converge, a plurality of routes may exist from a pin supplied with the clock to a pin having timing restrictions set thereto or a clock input pin of a sequential circuit cell. When considering a clock skew between pins having timing restrictions set thereto or sequential circuit cells on both ends of a data path, it is necessary to evaluate the clock skew and find a worst case from all combinations of the routes from the pin supplied with the clock to the pin having the timing restrictions set thereto or the clock input pin of the sequential circuit cell at the starting point of the data path, and the routes from the pin supplied with the clock to the pin having the timing restrictions set thereto or the clock input pin of the sequential circuit cell at the termination point of the data path, in order to calculate the worst clock skew.

This embodiment obtains a branch point of a clock route based on all combinations of clock routes from the pin supplied with the clock to the pins having the timing restrictions set thereto or the sequential circuit cells on both ends of the data path. The clock skew is calculated for the combination of the routes from the branch point which is obtained to the pins having the timing restrictions set thereto or the sequential circuit cells on both ends of the data path. The calculated clock skew is evaluated for all possible cases. Hence, of all of the possible cases, it is possible to specify the branch point having the worst clock skew, and the route from the branch point to the sequential circuit cell or the pin having the timing restrictions set thereto and having the worst clock skew.

Figure 13:
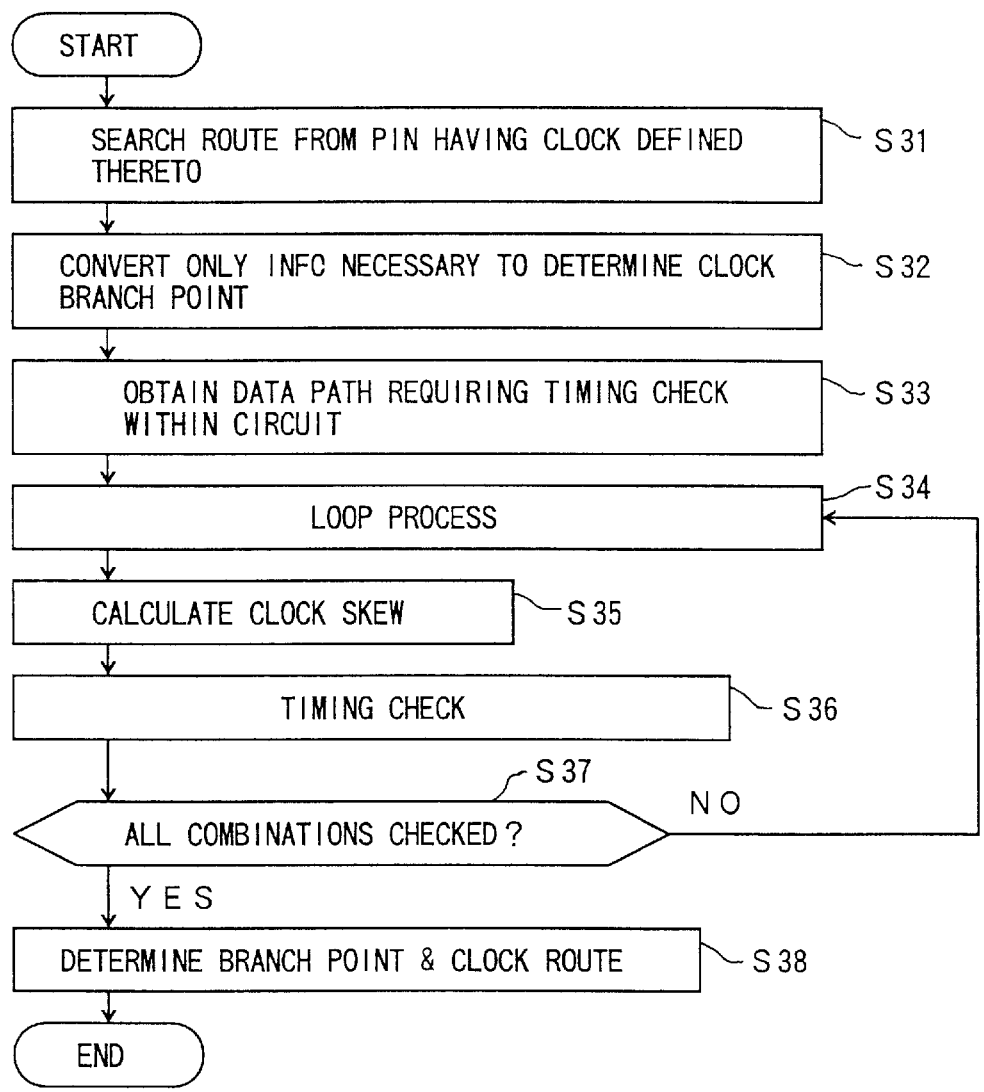
FIG. 13 is a flow chart for explaining the route search process by a fourth embodiment of the route searching method according to the present invention.

FIG. 13 is a flow chart for explaining the route search process of the CPU 201 of the computer system 100 when employing a fourth embodiment of the route searching method according to the present invention. The process shown in FIG. 13 corresponds to the program which is stored in a fourth embodiment of the storage medium according to the present invention.

In FIG. 13, a step S31 searches a route from a pin having a clock defined thereto to a pin having timing restrictions set thereto or a sequential circuit cell. A step S32 converts only information which becomes necessary when determining a clock branch point into a data structure which enables a high-speed retrieval. A step S33 obtains a data path which requires a timing check within the circuit, and determines pins having timing restrictions set thereto or sequential circuit cells on both ends of a data path. A step S34 carries out a loop process described hereunder for all combinations of routes of clocks reaching the determined pins on both ends of the data path.

A step S35 determines a branch point of the clock route, and calculates the clock skew. A step S36 carries out the timing check based on the timing restrictions, delay of the data path and the clock skew. A step S37 decides whether or not the checking has been made for all combinations of the clocks, and the process returns to the step S34 if the decision result in the step S37 is NO. On the other hand, if the decision result in the step S37 is YES, a step S38 obtains a case with the most strict timing conditions, determines the branch point and the clock route for this case, and the process ends.

Next, a description will be given of a fifth embodiment of the route searching method according to the present invention. The process carried out in this embodiment of the route searching method corresponds to the program which is stored in a fifth embodiment of the storage medium according to the present invention.

Depending on the circuit, the routes for supplying the clock from the clock input of the circuit to the pin having the timing restrictions set thereto or the sequential circuit cell, in many cases, may branch and join (converge) repeatedly in a complicated manner. In such cases, it is difficult to obtain a worst case where the clock skew between the pins having the timing restrictions set thereto or the sequential circuit cells on both ends of the data path becomes worst. In order to solve this problem, it is necessary to know all routes from the pin supplied with the clock, that is, the clock input of the circuit, to the pins having the timing restrictions set thereto or the sequential circuit cells connected on the downstream side of the clock input. In this case, this embodiment distinguishes the routes having different pins which are passed during the search. As a result, it is possible to easily determine the branch point on the clock route necessary when calculating the clock skew between the pins having the timing restrictions set thereto or between the sequential circuit cells. It is also possible to easily calculate the delay from the branch point to each sequential circuit cell.

Figure 14:
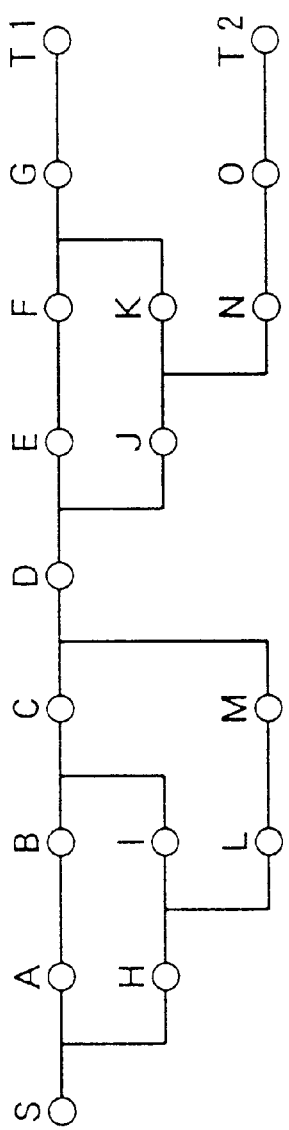
FIG. 14 is a diagram for explaining a fifth embodiment of the route searching method according to the present invention.

FIG. 14 is a diagram for explaining this embodiment, and corresponds to the step S31 shown in FIG. 13. In FIG. 14, a symbol "○" indicates a pin on the circuit, and a line connecting two pins indicates a path which includes wirings, circuit elements and the like and through which signals propagate. In addition, it is assumed for the sake of convenience that signals propagate from the left to right in FIG. 14.

In FIG. 14, S, A through O, T1 and T2 denote pins on the circuit. The pin S is supplied with the clock, and corresponds to the starting point of the route. The pins T1 and T2 are clock input pins of the sequential circuit cells or the pins having the timing restrictions set thereto. These pins T1 and T2 correspond to the termination points of the routes. The following six routes exist from the starting point S to the termination point T1.

S-A-B-C-D-E-F-G-T1
S-A-B-C-F-J-K-G-T1
S-H-I-C-D-E-F-G-T1
S-H-I-C-D-J-K-G-T1
S-H-L-M-D-E-F-G-T1
S-H-L-M-D-J-K-G-T1

The delay from the starting point S to the termination point T1 is calculated for each of the above six routes. It is possible to know the pins which were passed during the search by going upstream from the termination point T1 back to the starting point S.

Next, a description will be given of a sixth embodiment of the route searching method according to the present invention. The process carried out in this embodiment of the route searching method corresponds to the program which is stored in a sixth embodiment of the storage medium according to the present invention.

A part of the clock route having a possibility of becoming a branch point, is limited to the part of the clock route where the route branches. Hence, in this embodiment, the search is carried out by going upstream from the sequential circuit cell along the clock route, so as to obtain information related to each route returning to the pin supplied with the clock. A data structure of the route which passes only the pin which has the possibility of becoming a branch point and goes upstream from the sequential circuit cell to the pin supplied with the clock, is created based on the obtained information. As a result, it is possible to omit the calculation process with respect to each pin which has no possibility of becoming the branch point and is unnecessary when determining the branch point. Therefore, it is possible to reduce both the amount of data that is processed, and the data processing time.

Figure 15:
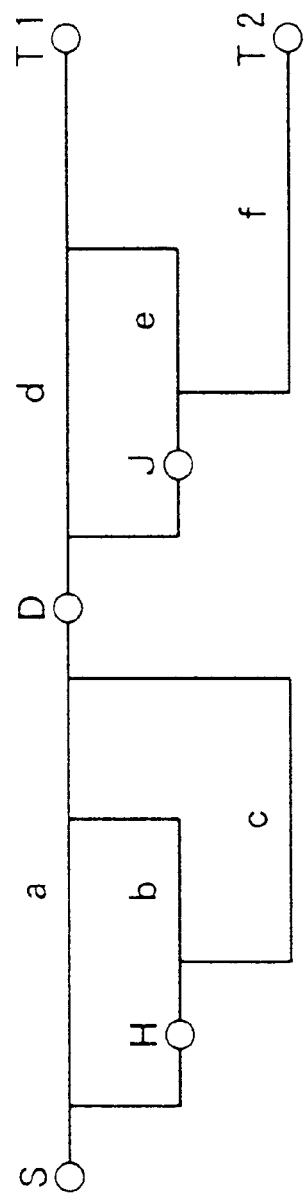
FIG. 15 is a diagram for explaining a sixth embodiment of the route searching method according to the present invention.

FIG. 15 is a diagram for explaining this embodiment, and corresponds to the step S32 shown in FIG. 13. In FIG. 15, those parts which are the same as those corresponding parts in FIG. 14 are designated by the same reference numerals, and a description thereof will be omitted. In FIG. 15, "a" through "f" denote paths.

In this embodiment, the data structure obtained by the fifth embodiment described above, is converted into the data structure in which the pins other than the pins (points) having the possibility of becoming the starting point, the termination point and the branch point are omitted. By this conversion of the data structure, the data structure shown in FIG. 15, in which the pins other than the pins D, H and J shown in FIG. 14 are omitted, is obtained. In this case, the following six routes exist from the starting point S to the termination point T1.

S-(a)-D-(d)-T1
S-(a)-D-J-(e)-T1
S-H-(b)-D-(d)-T1
S-H-(b)-D-J-(e)-T1
S-H-(c)-D-(d)-T1
S-H-(c)-D-J-(e)-T1

As may be seen from the above six routes, it is possible to reduce the number of passing points by one to three points as compared to the fifth embodiment. Consequently, it is possible to reduce the process of searching the branch point, and the data processing time is further reduced.

By using the data structure obtained by the sixth embodiment, the branch point and the clock skew between the starting point S and the termination points T1 and T2 are calculated as described hereunder. The following six routes exist from the starting point S to the termination point T1.

Route 1: S-(a)-D-(d)-T1
Route 2: S-(a)-D-J-(e)-T1
Route 3: S-H-(b)-D-(d)-T1
Route 4: S-H-(b)-D-J-(e)-T1
Route 5: S-H-(c)-D-(d)-T1
Route 6: S-H-(c)-D-J-(e)-T1

On the other hand, the following three routes exist from the starting point S to the termination point T2.

Route 7: S-(a)-D-J-(f)-T2
Route 8: S-H-(b)-D-J-(f)-T2
Route 9: S-H-(c)-D-J-(f)-T2

The clock skew and the branch point are obtained for the combinations of all of the routes 1 through 9 from the starting point S to the termination points T1 and T2. For example, the branch point of the routes 1 and 7 is determined as the point which is first reached on the route 1 during the process of going upstream towards the starting point S from the termination point T2 along the route 7. Accordingly, in this case, the pin D becomes the branch point of the routes 1 and 7. FIG. 16 is a diagram showing the clock skews and the branch points which are obtained for the combinations of all of the routes 1 through 9 from the starting point S to the termination points T1 and T2.

According to the fourth through sixth embodiments, although conventionally impossible, it is possible to determine the value of the worst clock skew and the branch point for this worst clock skew, in the case where the route for supplying the clock branches and joins repeatedly in a complicated manner. In addition, by restructuring the data structure by limiting the connection information of the circuit to the pins which have the possibility of becoming the branch point, it is possible to carry out the entire process at a high speed.

Next, a description will be given of a seventh embodiment of the route searching method according to the present invention. The process carried out in this embodiment of the route searching method corresponds to the program which is stored in a seventh embodiment of the storage medium according to the present invention.

When calculating the clock skew between the pins having the timing restrictions set thereto or the sequential circuit cells on the sending and receiving ends of the data path, a frequency dividing circuit, a phase locked loop (PLL) circuit and the like may exist between the branch point of the clock path and the pin having the timing restrictions set thereto or the sequential circuit cell on the sending or receiving end. In such a case, this embodiment uses the delay information which is consecutively calculated from the pin (clock source) which supplies the clock to the circuit to the pin having the timing restrictions set thereto or each sequential circuit cell, so as to accurately obtain the clock skew and the delays of the clock paths from the branch point to the pins having the timing restrictions set thereto or the sequential circuit cells on both ends of the data path.

Figure 17:
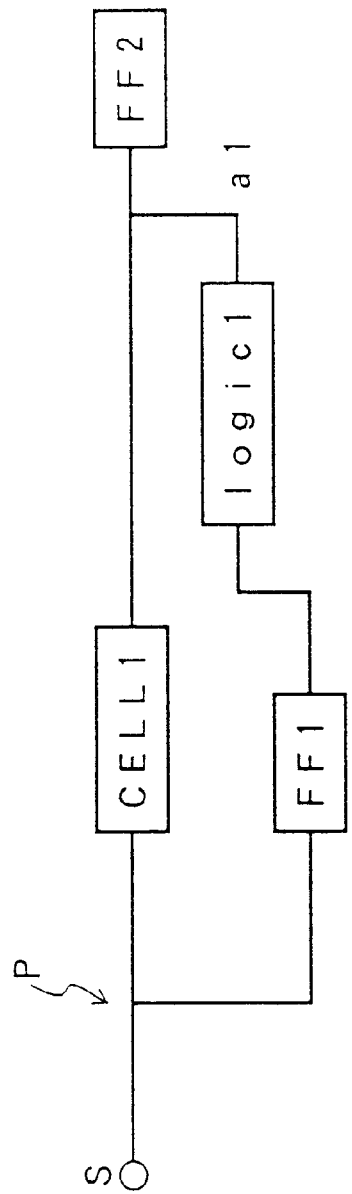
FIG. 17 is a diagram for explaining a seventh embodiment of the route searching method according to the present invention.

FIG. 17 is a diagram for explaining this embodiment. In FIG. 17, S denotes a pin of the clock supply source, CELL1 denotes a frequency dividing circuit or a PLL circuit, FF1 and FF2 denote sequential circuit cells, and logic1 denotes a combination circuit. A line connecting each of the circuits, circuit cells and/or pins indicates a path which includes wirings, circuit elements and the like and through which the signals propagate. In addition, it is assumed for the sake of convenience that the signals propagate from the left to the right in FIG. 17.

When checking the timing data of a data path al from the sequential circuit cell FF1 to the sequential circuit cell FF2, it is necessary to determine the clock skew between the sequential circuit cells FF1 and FF2. In order to determine the clock skew, this embodiment obtains the delays of the clock paths from the branch point P to the sequential circuit cells FF1 and FF2 on the routes from the pin S of the clock supply source to the sequential circuit cells FF1 and FF2. When obtaining the delays of the clock paths from the branch point P to the sequential circuit cells FF1 and FF2, it is possible to obtain the clock path to the sequential circuit cell FF1, similarly to the conventional method, because no frequency dividing circuit or the like is included between the branch point P and the sequential circuit cell FF1. However, if the conventional method is employed to obtain the clock path to the sequential circuit cell FF2, it is difficult to automatically determine the delay of this clock path because the frequency dividing circuit or PLL circuit CELL1 is included between the branch point P and the sequential circuit cell FF2. Hence, this embodiment obtains the delay of the clock path from the branch point P to the sequential circuit cell FF2 by utilizing the delay information of the clock path which is continuously calculated before and after the frequency dividing circuit or PLL circuit CELL1. As a result, this embodiment can obtain the clock skew between the sequential circuit cells FF1 and FF2.

According to the conventional technique, if a frequency dividing circuit or a PLL circuit is provided between a branch point of a clock path and two pins when calculating a clock skew between the two pins, it is impossible to calculate the clock skew. However, according to this seventh embodiment, it is possible to calculate an accurate clock skew even for such a case, and consequently, it is possible to improve the accuracy and efficiency of the timing check.

Next, a description will be given of an eighth embodiment of the route searching method according to the present invention. The process carried out in this embodiment of the route searching method corresponds to the program which is stored in an eighth embodiment of the storage medium according to the present invention.

In this embodiment, the delay of the clock path is consecutively calculated by passing the frequency dividing circuit or the PLL circuit on the clock path in the forward direction. Similarly to the case where no frequency dividing circuit or PLL circuit exists, it is possible to obtain the delays of the clock paths from all of the pins on the route from the clock supply source to the pins having the timing restrictions set thereto or the clock input pins of the sequential circuit cells, to the pins having the timing restrictions set thereto or the sequential circuit cells.

In other words, during the process of calculating the delay of the clock path from the pin S of the clock supply source in FIG. 17, the frequency dividing circuit or PLL circuit CELL1 is passed, and the calculation process to calculate the delay is made by searching the routes from the pin S to the sequential circuit cells FF1 and FF2 located on the downstream side of the frequency dividing circuit or PLL circuit CELL1 which is passed.

According to the conventional technique, if the frequency dividing circuit or PLL circuit exists on the clock path, it is necessary to separately calculate the delay from the clock supply source to the frequency dividing circuit or PLL circuit, and to specify the calculated part to the part where the frequency dividing circuit or PLL circuit is provided. However, according to this eighth embodiment, even if the frequency dividing circuit or PLL circuit exists on the clock path, the delay can be calculated consecutively before and after the frequency dividing circuit or PLL circuit, and as a result, it is possible to improve the accuracy and efficiency of the timing check.

Next, a description will be given of a ninth embodiment of the route searching method according to the present invention. The process carried out in this embodiment of the route searching method corresponds to the program which is stored in a ninth embodiment of the storage medium according to the present invention.

In a case where a pulse-triggered sequential circuit cell exists on the data path, the data propagation on the data path may be analyzed as follows. That is, even in a case where no signal transition of the data reaches the pulse-triggered sequential circuit cell before a leading edge of a pulse which can pass through the pulse-triggered sequential circuit cell, the signal transition can first be sent from the sequential circuit cell if the signal transition arrives while the pulse which can pass through is input to the clock terminal of the sequential circuit cell. Hence, this embodiment takes this into consideration, and checks whether or not the signal transition arrives and the data can pass through while the pulse which can pass through is input to the clock terminal of the pulse-triggered sequential circuit cell, in the case where the pulse-triggered sequential circuit cell exists on the data path. In addition, a check is made to determine whether or not the signal transition passing through the pulse-triggered sequential circuit cell arrives while keeping the timing restrictions of the sequential circuit cell or the pin having the timing restrictions set thereto which is provided on the downstream side of the pulse-triggered sequential circuit cell. Furthermore, a check is made to determine whether or not the signal transition output from the pulse-triggered sequential circuit cell satisfies the timing restrictions of the sequential circuit cell or the pin having the timing restrictions set thereto which is provided on the data path on the downstream side of the pulse-triggered sequential circuit cell. By carrying out these processes, it is possible to check whether or not the circuit satisfies the timing restrictions even in the case where the pulse-triggered sequential circuit cell is included within the circuit.

Figure 18:
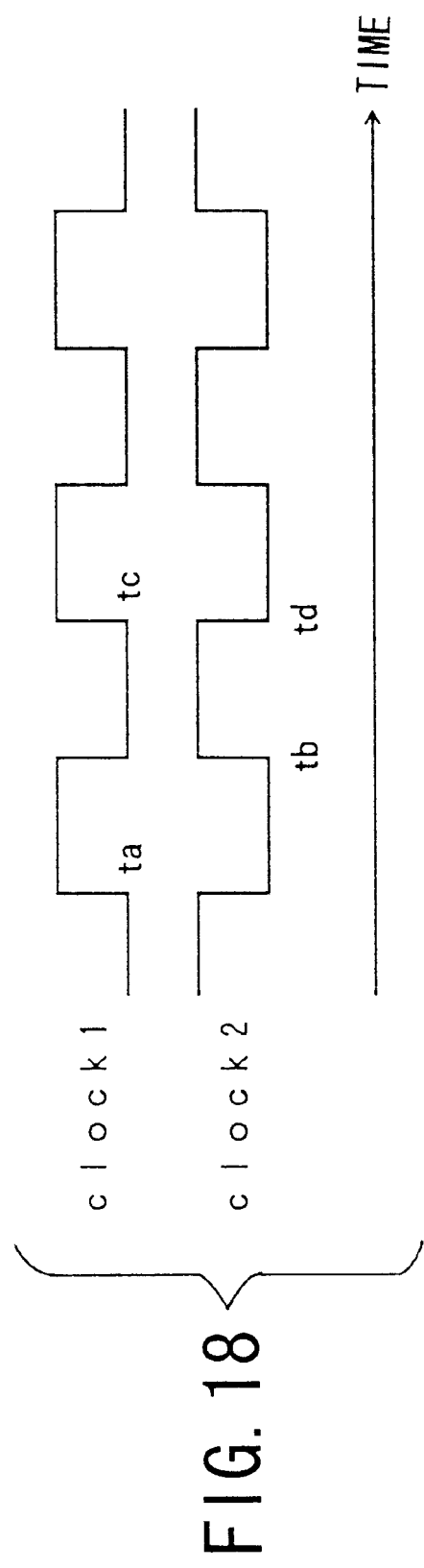
FIG. 18 is a timing chart showing clocks for explaining a ninth embodiment of the route searching method according to the present invention.

FIG. 18 is a timing chart showing clocks for explaining the ninth embodiment of the route searching method according to the present invention. In FIG. 18, clock1 and clock2 denote clocks, and ta through td denote timings on a time base which is taken along the abscissa.

Figure 19:
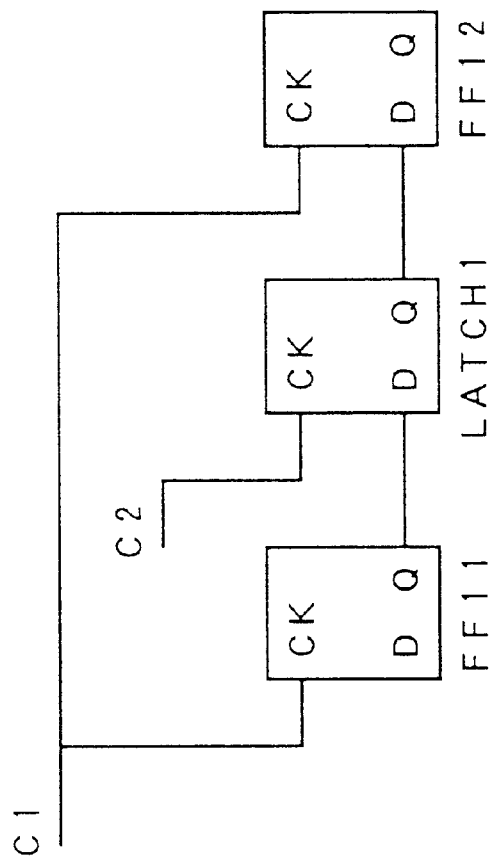
FIG. 19 is a diagram for explaining the ninth embodiment of the route searching method.

FIG. 19 is a diagram for explaining the ninth embodiment of the route searching method. In FIG. 19, the clock clock1 is input to a pin C1, and the clock clock2 is input to a pin C2. Edge-triggered sequential circuit cells FF11 and FF12 operate in response to a rising edge of the clock clock1. A pulse-triggered sequential circuit cell LATCH1 operates in response to a rising edge of the clock clock2. Each of the sequential circuit cells FF11, FF12 and LATCH1 have a clock terminal CK, a data output terminal Q and a data input terminal D. A line connecting the circuit cells and/or the pins indicate a path which includes wirings, circuit elements and the like and through which signals propagate. In addition, it is assumed for the sake of convenience that the signals propagate from the left to right in FIG. 19.

For example, in a case where the setup of the data path between the sequential circuit cell FF11 and the sequential circuit cell LATCH1 is checked, the check is made to determine whether or not the data output at the timing ta in FIG. 18 can pass through the sequential circuit cell LATCH1, that is, whether or not the data can reach the sequential circuit cell LATCH1 by the timing td. When checking the data path between the sequential circuit cells LATCH1 and FF12, the check is made to determine whether or not the data output at the timing tb can be received by the sequential circuit cell FF12 by the timing tc. When checking the data path between the sequential circuit cells FF11 and FF12, the check is made to determine whether or not the data output at the timing ta can be received by the sequential circuit cell FF2 by the timing tc. In the case of the circuit shown in FIG. 19, the necessary and sufficient condition for the normal data transfer on the route from the sequential circuit cell FF11 to the sequential circuit cell FF2 via the sequential circuit cell LATCH1, is that the results of the three kinds of checks described above are all YES.

Next, a description will be given of a tenth embodiment of the route searching method according to the present invention. The process carried out in this embodiment of the route searching method corresponds to the program which is stored in a tenth embodiment of the storage medium according to the present invention.

When searching the path (data path) between the pins having the timing restrictions set thereto or the sequential circuit cells in the signal propagating direction so as to make the timing check, this embodiment, with respect to a pulse-triggered sequential circuit cell such as the sequential circuit cell LATCH1 shown in FIG. 19, calculates the delay information up to this pulse-triggered sequential circuit cell, and further searches the path in the forward direction by passing this pulse-triggered sequential circuit cell. If a plurality of pulse-triggered sequential circuit cells are arranged in a sequence, the delay information is calculated up to each pulse-triggered sequential circuit cell and the search is further made by passing each pulse triggered sequential circuit cell.

In other words, in the case of the circuit shown in FIG. 19, this embodiment passes the route from data input terminal D to the data output terminal Q of the pulse-triggered sequential circuit cell LATCH1 when carrying out the route search with respect to the data path from the edge-triggered sequential circuit cell FF11, and consecutively calculates the delay information. Hence, it is possible to obtain the delay information of the route from the edge-triggered sequential circuit cell FF11 to the pulse-triggered sequential circuit cell LATCH1, and the delay information of the route from the edge-triggered sequential circuit cell FF11 and reaching the edge-triggered sequential circuit cell FF12 by passing the pulse-triggered sequential circuit cell LATCH1.

According to the ninth and tenth embodiments described above, it is possible to make the timing check by taking into consideration the pulse which can pass through a pulse-triggered sequential circuit cell.

Next, a description will be given of an eleventh embodiment of the route searching method according to the present invention. The process carried out in this embodiment of the route searching method corresponds to the program which is stored in an eleventh embodiment of the storage medium according to the present invention.

When obtaining the clock skew between the pins having the timing restrictions set thereto or the sequential circuit cells by specifying a PLL circuit, it is necessary to change the clock skew calculation method depending on whether a branch point is on the downstream side of the PLL circuit or is on the upstream side closer to the clock supply source than the PLL circuit. When the branch point is located on the downstream side of the PLL circuit, this embodiment calculates the delay from the branch point to the pin having the timing restrictions set thereto or the sequential circuit cell without taking into consideration the effects of the PLL circuit. On the other hand, when the branch point is located on the upstream side closer to the clock supply source than the PLL circuit, this embodiment calculates the delay by taking into consideration the effects of a feedback loop of the PLL circuit, because the PLL circuit is provided between the branch point and the pin having the timing restrictions set thereto or the sequential circuit cell. Therefore, even in the case of a circuit including a PLL circuit, it is possible to accurately calculate the clock skew by automatically taking into consideration the effects of the PLL circuit, depending on the relationship of the position of the branch point and the position of the PLL circuit.

Figure 20:
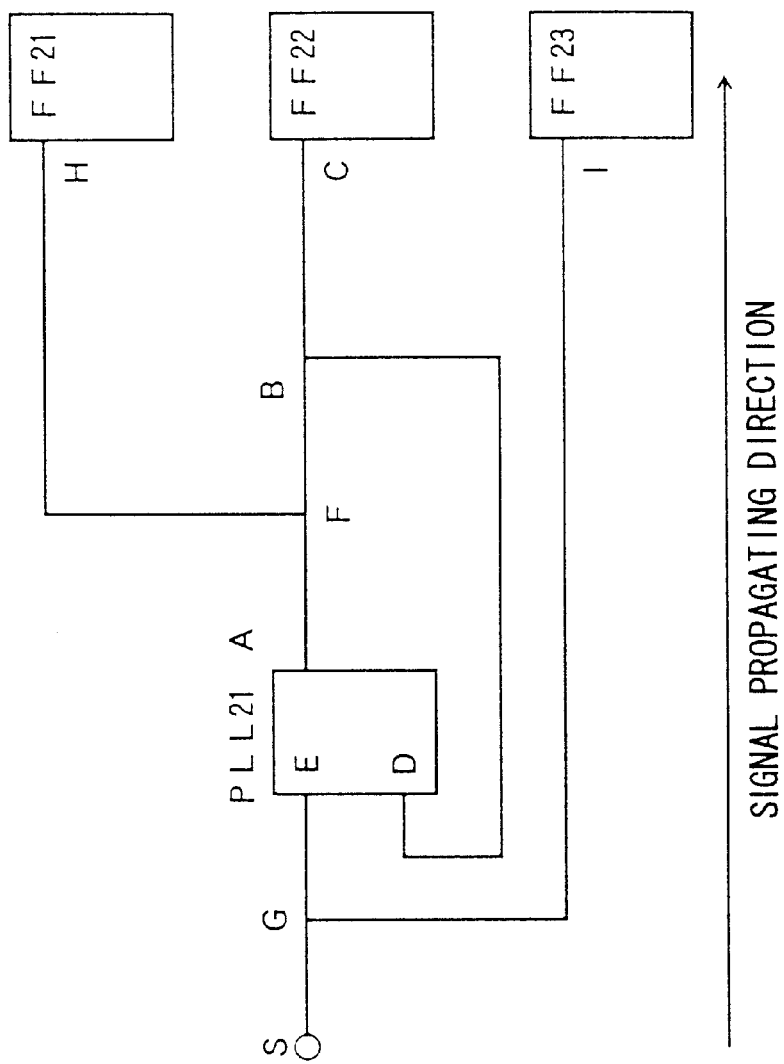
FIG. 20 is a diagram for explaining an eleventh embodiment of the route searching method according to the present invention.

FIG. 20 is a diagram for explaining the eleventh embodiment of the route searching method according to the present invention. In FIG. 20, S and A through I denote pins. More particularly, S denotes a pin of a clock supply source, FF21 through FF23 denote sequential circuit cells, and PLL21 denotes a PLL circuit. The PLL circuit PLL21 has an input pin E, an output pin A, and an input pin D of a PLL feedback loop. A line connecting the circuit cells and/or the pins indicates a path which includes wirings, circuit elements and the like and through which the signals propagate. It is assumed for the sake of convenience that the signals propagate from the left to right in FIG. 20.

As shown in FIG. 20, the clock skew is automatically calculated for first and second cases, by taking into consideration the characteristic of the PLL circuit PLL21. In the first case, the branch point (B, F) is provided at a position on the downstream side of the PLL circuit PLL21. On the other hand, in the second case, the branch point (G) is provided at a position on the up stream side closer to the clock supply source than the PLL circuit PLL21.

A description will now be given of the first case where the branch point of the clock path is provided at the position on the downstream side of the PLL circuit PLL21. In the case of the sequential circuit cells FF21 and FF22 shown in FIG. 20, the branch point F is provided on the downstream side of the PLL circuit PLL21. Hence, the effects of the feedback loop of the PLL circuit PLL21 are not taken into consideration, because the clock skew is obtained from the difference between the delays from the branch point F to the sequential circuit cells FF21 and FF22.

Next, a description will be given of the second case where the branch point is provided at the position on the upstream side closer to the clock supply source than the PLL circuit PLL21. In the case of the sequential circuit cells FF21 and FF22 shown in FIG. 20, the branch point G is provided at the position on the upstream side closer to the clock supply source than the PLL circuit PLL21. Since the PLL circuit PLL21 is provided between the branch point G and the sequential circuit cell FF22, the delay time must be calculated by taking into consideration the characteristic of the PLL circuit PLL21. Accordingly, the delay of the clock from the branch point G to the sequential circuit cell FF22 is calculated by taking into consideration the effects of the feedback loop of the PLL circuit PLL21, and the clock skew is obtained based on this calculated delay and the delay of the clock from the branch point G to the sequential circuit cell FF23.

Next, a description will be given of a twelfth embodiment of the route searching method according to the present invention. The process carried out in this embodiment of the route searching method corresponds to the program which is stored in a twelfth embodiment of the storage medium according to the present invention.

When taking into consideration the effects of the feedback loop of the PLL circuit in the eleventh embodiment described above, this embodiment temporarily obtains a branch point of the feedback loop of the PLL circuit and a route through which the clock propagates and extends from the PLL circuit to a target pin having the timing restrictions set thereto or a target sequential circuit cell on the downstream side of the PLL circuit. Using this temporarily obtained branch point as a boundary, the delay is calculated for three portions, so as to obtain the delay of the route by making the timing check under more strict conditions. The three portions include a common portion of the feedback loop and a portion of the route through which the clock propagates, a feedback loop portion excluding the common portion, and a portion of the route through which the clock propagates and excluding the common portion. The common portion corresponds to the portion from the PLL circuit to the temporarily obtained branch point. In addition, the feedback loop portion excluding the common portion, corresponds to a portion from the temporarily obtained branch point to the input pin of the feedback loop of the PLL circuit. Furthermore, the portion of the route through which the clock propagates and excluding the common portion, corresponds to a portion from the temporarily obtained branch point to the target pin having the timing restrictions set thereto or the target sequential circuit cell.

In other words, when the PLL circuit exists in the route from the branch point to the sequential circuit cell, this eleventh embodiment calculates the delay of the circuit shown in FIG. 20 in the following manner for the route from the pin S of the clock supply source to the pin C, that is, the sequential circuit cell FF22.

In each of routes S-E, E-A, A-B, B-C and B-D, a maximum delay and a minimum delay exist even for the same route, because inconsistencies of the delay caused by temperature or the like are taken into consideration. For example, with respect to the route A-B, a maximum delay value is denoted by AB(max), a minimum delay value is denoted by AB(min), and similar designations are used to indicate the maximum and minimum delay values of the other routes.

In this case, due to the characteristic of the PLL circuit PLL21, the delay from the pin S to the pin C is smaller than the sum of the delays of each of the routes S-E, E-A, A-B and B-C by the delay corresponding to the feedback loop portion. The route S-C includes a portion A-B which is common to a feedback loop portion A-B-D. Hence, when the inconsistencies are taken into consideration, the maximum delay value SC(max) of the route S-C is not simply obtainable by subtracting the minimum delay value of the feedback loop portion A-B-D from the sum of the maximum delay values from the pin S to the pin C. For this reason, the maximum delay value SC(max) of the route S-C is obtained as follows.

$$SC(\text{max}) = SE(\text{max}) + EA(\text{max}) + AB(\text{max}) + BC(\text{max}) -$$
$$EA(\text{max}) - AB(\text{max}) - BD(\text{min})$$
$$= SE(\text{max}) + BC(\text{max}) - BD(\text{min})$$

Similarly, the minimum delay value SC(min) of the route S-C is obtained as follows.

$$SC(\text{min}) = SE(\text{min}) + BC(\text{min}) - BD(\text{max})$$

The branch point of the route from the PLL circuit to the sequential circuit cell on the downstream side and the feedback loop depends on the route from the PLL circuit to the sequential circuit cell. Accordingly, at the time when a target route from a specific pin to a sequential circuit cell is determined, this embodiment finds a branch point of a feedback loop of a PLL circuit and the target route if the PLL circuit exists in this target route, and automatically and accurately calculates the delay of the target route using the formulas described above.

In the case where the PLL circuit exists within the route, it is impossible to calculate the delay by taking into consideration the characteristic of the PLL circuit according to the conventional technique. However, according to the eleventh and twelfth embodiments described above, it is possible to calculate the delay by taking into consideration the characteristic of the PLL circuit. In addition, the eleventh and twelfth embodiments can accurately obtain the clock skew for the case where the PLL circuit exists in the route. Therefore, the timing check performance is improved according to the eleventh and twelfth embodiments.

Next, a description will be given of a thirteenth embodiment of the route searching method according to the present invention. The process carried out in this embodiment of the route searching method corresponds to the program which is stored in a thirteenth embodiment of the storage medium according to the present invention.

In this embodiment, with respect to the data path between the pins having the timing restrictions set thereto or the sequential circuit cells, if conditions exist for the pins which are to be passed by the route, routes which satisfy the conditions are selected. The timing check is made with respect to a route having the minimum or maximum delay of the selected routes.

Figure 21:
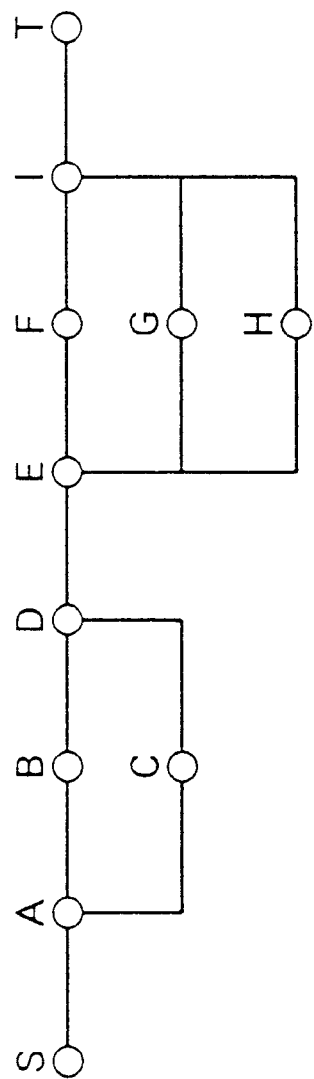
FIG. 21 is a diagram for explaining a thirteenth embodiment of the route searching method according to the present invention.

FIG. 21 is a diagram for explaining this thirteenth embodiment. In FIG. 21, S, A through I, and T denote pins. More particularly, S denotes the pin supplied with the clock, and corresponds to the starting point of the route. In addition, T denotes a clock input pin of a sequential circuit cell or a pin having timing restrictions set thereto, and corresponds to the termination point of the route. Furthermore, a symbol "○" indicates a pin on the circuit, and a line connecting two pins indicates a path which includes wirings, circuit elements and the like and through which signals propagate. For the sake of convenience, it is assumed that the signals propagate from the left to right in FIG. 21.

In FIG. 21, a route from the starting point S to the termination point S can be one of six possible routes depending on the conditions of the pins to be passed. If route conditions exist, a route which is most difficult to satisfy the timing restrictions is selected from the routes which satisfy the route conditions. In other words, the route having the most strict timing restrictions is selected, and the timing check is made with respect to this route. For example, the setup check of the route from the pin S to the pin T is made, and if the route conditions require the route not to pass the pin B and not to pass both the pins C and G, the following two routes satisfy such conditions.

S-A-C-D-E-F-I-T
S-A-C-D-E-H-I-T

In this case, the route having the larger delay is selected from the above two routes because the setup check is being made, and a check is made to determine whether or not the timing restrictions are satisfied by the selected route.

According to the conventional technique, it is impossible to specify a route which is logically inactive during the timing check, so as to exclude the specified route from the timing check. On the other hand, in a case where the logically inactive route is known in advance, this thirteenth embodiment can specify such a logically inactive route so as to be excluded from the timing check. In addition, of the routes other than the routes which are specified to be excluded from the timing check, a route having the worst delay is selected, and this thirteenth embodiment makes the timing check with respect to this selected route having the worst delay.

Next, a description will be given of a fourteenth embodiment of the route searching method according to the present invention. The process carried out in this embodiment of the route searching method corresponds to the program which is stored in a fourteenth embodiment of the storage medium according to the present invention.

In a case where conditions of the pins to be passed by the route exist in the thirteenth embodiment described above, this fourteenth embodiment compares information of the pins passed by each route and specified conditions, so as to select a route which satisfies the conditions.

In other words, when the route conditions of the thirteenth embodiment described above exist, a judgement to determine whether or not a certain route satisfies the route conditions is made as follows. For example, in a case where the route conditions require that the route does not pass the pin B shown in FIG. 21 and does not pass both the pins C and G, the following routes 11 through 14 exist as possible routes from the pin S to the pin T satisfying such route conditions.

Route 11: S-A-B-D-E-G-I-T
Route 12: S-A-B-D-E-H-I-T
Route 13: S-A-C-D-E-F-I-T
Route 14: S-A-C-D-E-G-I-T When the routes 11 through 14 and the route conditions are compared, it is seen that the routes 11 and 12 pass the pin B, and the route 14 passes both the pins C and G. For this reason, only the route 13 satisfies the specified route conditions in this case, and this route 13 is selected.

Next, a description will be given of a fifteenth embodiment of the route searching method according to the present invention. The process carried out in this embodiment of the route searching method corresponds to the program which is stored in a fifteenth embodiment of the storage medium according to the present invention.

In a case where a plurality of routes satisfy the same route pass conditions at a target pin in the thirteenth embodiment described above, this fourteenth embodiment selects one route having a minimum or maximum delay of the routes satisfying the same route pass conditions, and the route on the downstream side of the target pin is searched using the delay information of the selected route.

In other words, if the target pin is the pin I shown in FIG. 21, the following routes 31 through 36 exist as possible routes from the pin S to the target pin I satisfying such route pass conditions.

Route 31: S-A-B-D-E-F-I
Route 32: S-A-B-D-E-G-I
Route 33: S-A-B-D-E-H-I
Route 34: S-A-C-D-E-F-I
Route 35: S-A-C-D-E-G-I
Route 36: S-A-C-D-E-H-I Depending on the route pass conditions these routes 31 through 36 are grouped into route groups which satisfy the same pass conditions. For example, a route group is formed by the routes 31 and 33, a route group is formed by the route 32, a route group is formed by the routes 34 and 36, and a route group is formed by the route 35. In other words, four route groups are formed in this particular case. In this case, a route having the minimum or maximum delay is selected from each route group. With respect to the route which is selected from each route group, the route on the downstream side of the pin I is searched, and the delay of this route is calculated. For example, if the route having the minimum delay is selected from each of the route groups and the delays of the routes 33 and 34 are small when the delays of the routes 31 and 33 and the delays of the routes 34 and 36 are respectively compared, four routes 32 through 35 are selected as satisfying the conditions. Based on the route information of these four routes 32 through 35, the route information of routes from the pin I to the pin T on the downstream side are created, and the following routes 32' through 35' are obtained.

Route 32': S-A-B-D-E-G-I-T
Route 33': S-A-B-D-E-H-I-T
Route 34': S-A-C-D-E-F-I-T
Route 35': S-A-C-D-E-G-I-T Next, a description will be given of a sixteenth embodiment of the route searching method according to the present invention. The process carried out in this embodiment of the route searching method corresponds to the program which is stored in a sixteenth embodiment of the storage medium according to the present invention.

In this embodiment, measures are taken so that, at a target pin, it is possible to refer to information of the pins passed from the starting point of the route to the target pin. Hence, it is possible to categorize the routes by comparing the conditions of the routes from the starting point to the target pin.

In other words, in the fifteenth embodiment described above, the following categorization is made with respect to the route information of the target pin depending on the route pass conditions. For example, if the route conditions require that the route does not pass the pin B and does not pass both the pins C and G, a mark which indicates that the route information is set is added to the pins B, C and G which have route conditions set thereto. Of the routes which reach the target pin, the routes which pass the marked pins which are added with the same mark are categorized as the same kind of route and categorized accordingly. In addition, routes which pass different numbers of marked pins are categorized as different kinds of route, although the these routes pass through the marked pins added with the same mark. In other words, a route is categorized as a different kind if the number of marked pins passed differs by at least one when compared to that of another route, even when the marked pins of the two routes are added with the same mark.

In FIG. 21, when the target pin is the pin I, the following six routes exist from the pin S to the target pin I.

Route 41: S-A-B-D-E-F-I
Route 42: S-A-B-D-E-G-I
Route 43: S-A-B-D-E-H-I
Route 44: S-A-C-D-E-F-I
Route 45: S-A-C-D-E-G-I
Route 46: S-A-C-D-E-H-I The pins B, C, and G are marked pins. Hence, when attention is drawn to these three marked pins B, C, and G, it is seen that the route 41 passes the marked pin B, the route passes the marked pins B and G, the route 43 passes the marked pin B, the route 44 passes the marked pin C, the route 45 passes the marked pins C and G, and the route passes the marked pin C. Accordingly, the sixth routes 41 through 46 in this case can be categorized into four route groups, namely, the route group formed by the routes 41 and 43, the route group formed by the route 42, the route group formed by the routes 44 and 46, and the route group formed by the route 45.

Next, a description will be given of a seventeenth embodiment of the route searching method according to the present invention. The process carried out in this embodiment of the route searching method corresponds to the program which is stored in a seventeenth embodiment of the storage medium according to the present invention.

In this embodiment, a slack is obtained for each route, based on the result of the timing check, and the obtained slack is set with respect to the point within the route. The slack refers to a difference or error between the delay value which is required for the target route to satisfy the timing restrictions and the actual delay value of the target route. In the case of the setup check, the slack is obtained by subtracting the actual delay value of the target route from the delay value which is required for the target route to satisfy the timing restrictions. In addition, in the case of a hold check, the slack is obtained by subtracting the delay value which is required for the target route to satisfy the timing restrictions from the actual delay value of the target route. By carrying out the timing check with respect to the entire circuit or a part of the circuit and setting the slack, it becomes possible to find the cause of the timing error based on the slack information which is set with respect to each pin.

In other words, a plurality of slacks are set with respect to each pin on the circuit, for each route passing the pin. Of the slacks set with respect to each pin, a worst slack value, that is, a slack value indicating a largest error, is regarded as a representative slack value for the pin. It may be seen that the pin having the worst representative slack value within the circuit is the cause of the timing error within the circuit. In addition, from a distribution of the slack values, it is possible to easily specify the locations where the timing improvement is necessary.

Next, a description will be given of an eighteenth embodiment of the route searching method according to the present invention.

When determining the slack of the pin within the route in the seventeenth embodiment described above, this eighteenth embodiment calculates the slack value of each pin on the route based on the delay information which is calculated along the route at the time of the delay calculation process.

In other words, when the timing check is made, it is possible to determine the slack value from the delays of the route respectively obtained by the setup check and the hold check and the actual delay of the route. For this reason, this embodiment sets the determined slack value with respect to all of the pins on the route subjected to the timing check. In addition, even with respect to the route not subjected to the timing check due to the joining of routes, the slack value is determined in the following manner based on the slack value at the joining point, and the determined slack value is set for the points on the route.

For example, it is assumed for the sake of convenience that the slack of a target pin is already determined. A route from a preceding stage joins at the target pin, and one route up to the preceding stage is selected so as to calculate the delay of the target pin based on the delay from the selected route. In addition, the delay value of the target pin is calculated for a case via a non-selected route other than the selected route. The slack value of the non-selected route is calculated based on the delay value of the non-selected route, the delay value of the selected route and the slack value of the target pin. The following formulas may be used for the calculation of the slack.

For Setup Check:

(slack value of non-selected route)=(slack value of target pin)+ (delay of target pin when target pin is reached via selected route)−(delay of target pin when target pin is reached via non-selected route)

For Hold Check:

(slack value of non-selected route)=(slack value of target pin)− (delay of target pin when target pin is reached via selected route)+(delay of target pin when target pin is reached via non-selected route)

The slack value of the non-selected route which is determined in the above described manner is set to the starting point of the route search, with respect to the pins on the non-selected route preceding the target pin. At the joining point of the routes, such a process is carried out recursively, so as to set the slack value with respect to all of the routes.

Figure 22:
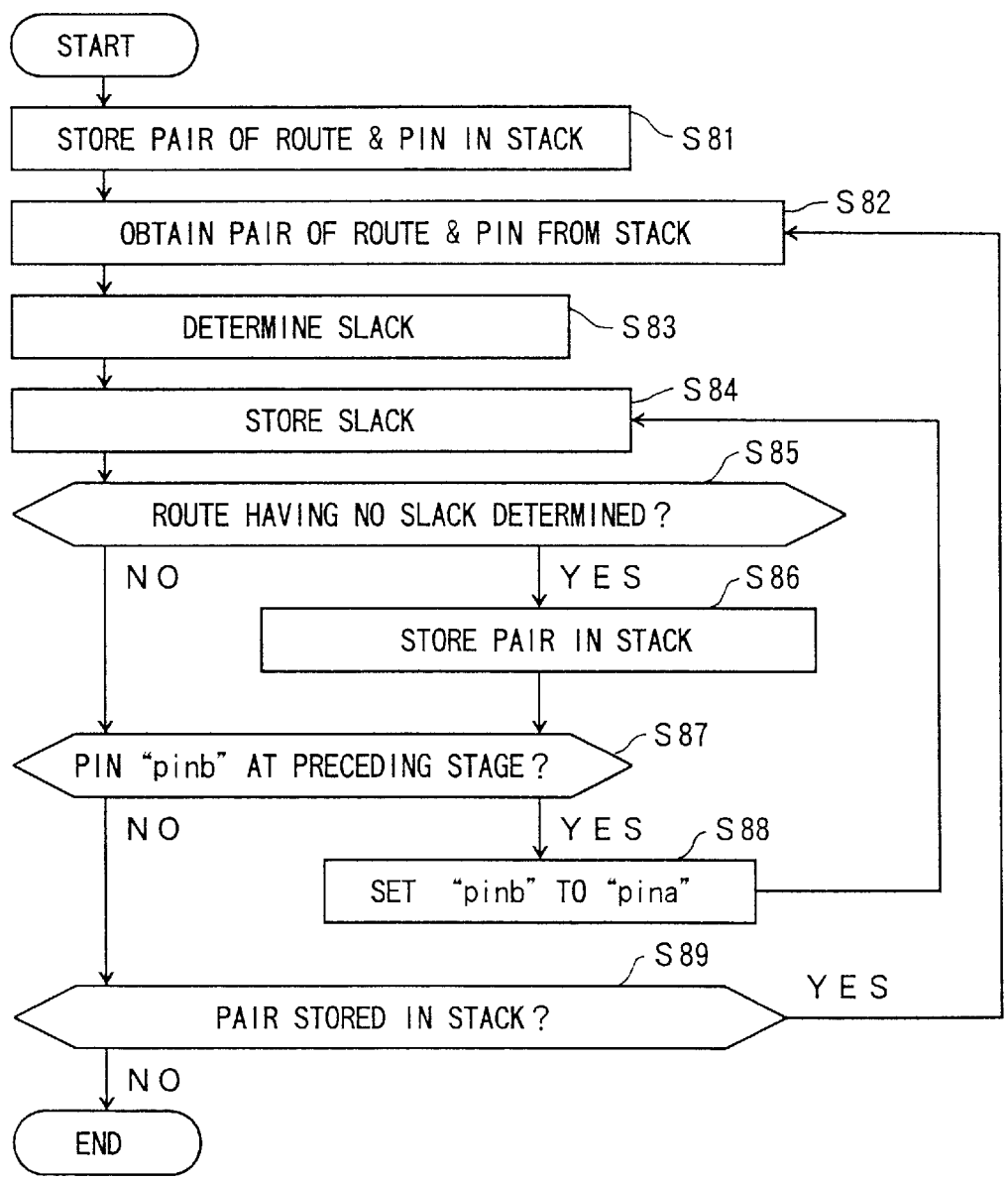
FIG. 22 is a flow chart for explaining the route search process by an eighteenth embodiment of the route searching method according to the present invention.

FIG. 22 is a flow chart for explaining the route search process of the CPU 201 of the computer system 100 when employing the eighteenth embodiment of the route searching method according to the present invention. The process shown in FIG. 22 corresponds to the program which is stored in the eighteenth embodiment of the storage medium according to the present invention.

In FIG. 22, a step S81 stores in the stack 10 within the memory part 202, for example, a pair formed by the route selected during the timing check and the pin at the termination point. A step S82 obtains a pair of a route "routea" and a pin "pina" from the stack. A step S83 determines a slack value "slack" of the pin "pina". The slack value of the route selected during the timing check is calculated from the result of the timing check. The slack value of the non-selected route which is not selected during the timing check is determined from a delay difference between the target route and the route for which the slack value is already determined of the routes reaching the pin "pina".

A step S84 stores the slack value "slack" in a slack value storage region for the pin "pina" within the memory part 202, for example. A step S85 decides whether or not a route "routeb" other than the route "routea" for which the slack value "slack" is not determined exists in the routes reaching the pin "pina". The process advances to a step S86 if the decision result in the step S85 is YES, and the process advances to a step S87 if the decision result in the step S85 is NO.

The step S86 stores a pair formed by the route "routeb" and the pin "pina" in the stack, and 35 the process advances to the step S87. The step S87 decides whether or not a pin "pinb" in a stage preceding the pin "pina" exists when the route is gone upstream according to the route "routea". The process advances to a step S88 if the decision result in the step S87 is YES, and the process advances to a step S89 if the decision result in the step S87 is NO. The step S88 sets the pin "pinb" to "pina", and the process returns to the step S84. In addition, the step S89 decides whether or not a pair formed by the route and the pin is stored in the stack. The process returns to the step S82 if the decision result in the step S89 is YES. On the other hand, the process ends if the decision result in the step S89 is NO.

According to the conventional technique, it is difficult to specify a cell which is the cause for being unable to satisfy the timing conditions. However, according to the eighteenth embodiment described above, it is possible to specify the portion within the circuit, which is the cause for being unable to satisfy the timing conditions. In addition, by interfacing the information related to the slack value of each pin in the phase which makes the timing improvement, it is possible to make the timing improvement within a short time.

Further, the present invention is not limited to these embodiments, but various variations and modifications may be made without departing from the scope of the present invention.

What is claimed is:

1. A route searching method used for circuit design, comprising:
   setting, with respect to each pin of a circuit which includes wirings and circuit elements, at least one of a pass flag which indicates that a pin is passed, a searching flag which indicates that a pin is being searched, and a branch flag which indicates that a pin is a branch point; and
   determining a direction of a route search depending on each flag which is set with respect to each pin.

2. The route searching method as claimed in claim 1, further comprising:
   setting, with respect to each pin, a calculation level which successively changes value for each pin as a search progresses from a starting point of the route search in a forward direction; and
   determining an order of calculation processes based on the calculation level.

3. A route searching method used for circuit design, comprising:
   setting, with respect to each pin, a corresponding flag of a pass flag which indicates that a pin is passed, a searching flag which indicates that a pin is being searched, and a branch flag which indicates that a pin is a branch point;
   determining a direction of a route search depending on each flag which is set with respect to each pin;
   recognizing a loop pin based on the pass flag and the searching flag; and
   during a route search, progressing the route search in a forward direction after carrying out a calculation process with respect to the loop pin when the loop pin is reached a first time, and stopping the route search after carrying out a calculation process with respect to the loop pin when the loop pin is reached a second time.

4. A route searching method used for circuit design, comprising:
   setting, with respect to each pin, a corresponding flag of a pass flag which indicates that a pin is passed, a searching flag which indicates that a pin is being searched, and a branch flag which indicates that a pin is a branch point;
   determining a direction of a route search depending on each flag which is set with respect to each pin;
   obtaining a branch point of a clock route, based on all combinations of clock routes from a pin supplied with a clock to pins having timing restrictions set thereto or sequential circuit cells located on both ends of a data path;
   calculating a clock skew with respect to a combinations of routes from the branch point which is obtained to the pins having the timing restrictions set thereto or the sequential circuit cells located on both ends of the data path; and
   evaluating the clock skew which is calculated.

5. A route searching method used for circuit design, comprising:
   setting, with respect to each pin, a corresponding flag of a pass flag which indicates that a pin is passed, a searching flag which indicates that a pin is being searched, and a branch flag which indicates that a pin is a branch point;
   determining a direction of a route search depending on each flag which is set with respect to each pin; and
   when calculating a clock skew between pins having timing restrictions set thereto or sequential circuit cells on sending and receiving ends of a data path, and if a frequency dividing circuit or a PLL circuit exists between a branch point of a clock path and the pins having the timing restrictions set thereto or the sequential circuit cells on the sending and receiving ends, using delay information which is consecutively calculated from a pin which supplies a clock to the circuit and the pins having the timing restrictions set thereto or the sequential circuit cells, so as to calculate a clock skew and a delay of the clock path from the branch point to the pins having the timing restrictions set thereto or the sequential circuit cells on both ends of the data path.

6. A route searching method used for circuit design, comprising:
   setting, with respect to each pin, a corresponding flag of a pass flag which indicates that a pin is passed, a searching flag which indicates that a pin is being searched, and a branch flag which indicates that a pin is a branch point;

determining a direction of a route search depending on each flag which is set with respect to each pin; and calculating a delay from a branch point to a pin having timing restrictions set thereto or a sequential circuit cell without taking into consideration effects of a PLL circuit when the branch point is located on a downstream side of the PLL circuit in a direction of the route search, and calculating the delay by taking into consideration effects of a feedback loop of the PLL circuit when the branch point is located closer to a clock supply source than the PLL circuit.

7. A route searching method used for circuit design, comprising:

setting, with respect to each pin, a corresponding flag of a pass flag which indicates that a pin is passed, a searching flag which indicates that a pin is being searched, and a branch flag which indicates that a pin is a branch point;

determining a direction of a route search depending on each flag which is set with respect to each pin; and obtaining a slack for each route based on a result of a timing check, and setting the slack which is obtained with respect to points on the route.

8. A computer-readable storage medium which stores a program for causing a computer to carry out a route search for use in circuit design, said program comprising:

a flag set procedure causing the computer to set, with respect to each pin of a circuit which includes wirings and circuit elements, at least one of a pass flag which indicates that a pin is passed, a searching flag which indicates that a pin is being searched, and a branch flag which indicates that a pin is a branch point; and a determining procedure causing the computer to determine a direction of a route search depending on each flag which is set with respect to each pin.

9. The computer-readable storage medium as claimed in claim 8, wherein the program further comprises:

a procedure causing the computer to set, with respect to each pin, a calculation level which successively changes value for each pin as a search progresses from a starting point of the route search in a forward direction; and a procedure causing the computer to determine an order of calculation processes based on the calculation level.

10. A computer-readable storage medium which stores a program for causing a computer to carry out a route search for use in circuit design, said program comprising:

a flag set procedure causing the computer to set, with respect to each pin, a corresponding flag of a pass flag which indicates that a pin is passed, a searching flag which indicates that a pin is being searched, and a branch flag which indicates that a pin is a branch point;

a determining procedure causing the computer to determine a direction of a route search depending on each flag which is set with respect to each pin;

a procedure causing the computer to recognize a loop pin based on the pass flag and the searching flag; and a procedure causing the computer, during a route search, to progress the route search in a forward direction after carrying out a calculation process with respect to the loop pin when the loop pin is reached for a first time, and to stop the route search after carrying out a calculation process with respect to the loop pin when the loop pin is reached a second time.

11. A computer-readable storage medium which stores a program for causing a computer to carry out a route search for use in circuit design, said program comprising:

a flag set procedure causing the computer to set, with respect to each pin, a corresponding flag of a pass flag which indicates that a pin is passed, a searching flag which indicates that a pin is being searched, and a branch flag which indicates that a pin is a branch point;

a determining procedure causing the computer to determine a direction of a route search depending on each flag which is set with respect to each pin;

a procedure causing the computer to obtain a branch point of a clock route, based on all combinations of clock routes from a pin supplied with a clock to pins having timing restrictions set thereto or sequential circuit cells located on both ends of a data path;

a procedure causing the computer to calculate a clock skew with respect to a combinations of routes from the branch point which is obtained to the pins having the timing restrictions set thereto or the sequential circuit cells located on both ends of the data path; and a procedure causing the computer to evaluate the clock skew which is calculated.

12. A computer-readable storage medium which stores a program for causing a computer to carry out a route search for use in circuit design, said program comprising:

a flag set procedure causing the computer to set, with respect to each pin, a corresponding flag of a pass flag which indicates that a pin is passed, a searching flag which indicates that a pin is being searched, and a branch flag which indicates that a pin is a branch point;

a determining procedure causing the computer to determine a direction of a route search depending on each flag which is set with respect to each pin; and a procedure, when calculating a clock skew between pins having timing restrictions set thereto or sequential circuit cells on sending and receiving ends of a data path, and if a frequency dividing circuit, a PLL circuit or the like exists between a branch point of a clock path and the pins having the timing restrictions set thereto or the sequential circuit cells on the sending and receiving ends, causing the computer to use delay information which is consecutively calculated from a pin which supplies a clock to the circuit and the pins having the timing restrictions set thereto or the sequential circuit cells, so as to calculate a clock skew and a delay of the clock path from the branch point to the pins having the timing restrictions set thereto or the sequential circuit cells on both ends of the data path.

13. A computer-readable storage medium which stores a program for causing a computer to carry out a route search for use in circuit design, said program comprising:

a flag set procedure causing the computer to set, with respect to each pin, a corresponding flag of a pass flag which indicates that a pin is passed, a searching flag which indicates that a pin is being searched, and a branch flag which indicates that a pin is a branch point;

a determining procedure causing the computer to determine a direction of a route search depending on each flag which is set with respect to each pin; and a procedure causing the computer to calculate a delay from a branch point to a pin having timing restrictions set thereto or a sequential circuit cell without taking into consideration effects of a PLL circuit when the branch point is located on a downstream side of the PLL circuit in a direction of the route search, and to calculate the delay by taking into consideration effects of a feedback loop of the PLL circuit when the branch point is located closer to a clock supply source than the PLL circuit.

14. A computer-readable storage medium which stores a program for causing a computer to carry out a route search for use in circuit design, said program comprising:

a flag set procedure causing the computer to set, with respect to each pin, a corresponding flag of a pass flag which indicates that a pin is passed, a searching flag which indicates that a pin is being searched, and a branch flag which indicates that a pin is a branch point;

a determining procedure causing the computer to determine a direction of a route search depending on each flag which is set with respect to each pin; and a procedure causing the computer to obtain a slack for each route based on a result of a timing check, and to set the slack which is obtained with respect to points on the route.

15. A computer-readable storage medium which stores a program for causing a computer to carry out a route search for use in circuit design, by:

setting, with respect to each pin of a circuit which includes wirings and circuit elements, at least one of a pass flag which indicates that a pin is passed, a searching flag which indicates that a pin is being searched, and a branch flag which indicates that a pin is a branch point; and determining a direction of a route search depending on each flag which is set with respect to each pin.

16. The computer-readable storage medium as claimed in claim 15, wherein the program further causes the computer to carry out the route search, by:

setting, with respect to each pin, a calculation level which successively changes value for each pin as a search progresses from a starting point of the route search in a forward direction; and determining an order of calculation processes based on the calculation level.

17. A computer-readable storage medium which stores a program for causing a computer to carry out a route search for use in circuit design, by:

setting, with respect to each pin, a corresponding flag of a pass flag which indicates that a pin is passed, a searching flag which indicates that a pin is being searched, and a branch flag which indicates that a pin is a branch point;

determining a direction of a route search depending on each flag which is set with respect to each pin;

recognizing a loop pin based on the pass flag and the searching flag; and during a route search, progressing the route search in a forward direction after carrying out a calculation process with respect to the loop pin when the loop pin is reached for a first time, and stopping the route search after carrying out a calculation process with respect to the loop pin when the loop pin is reached a second time.

18. A computer-readable storage medium which stores a program for causing a computer to carry out a route search for use in circuit design, by:

setting with respect to each pin, a corresponding flag of a pass flag which indicates that a pin is passed, a searching flag which indicates that a pin is being searched, and a branch flag which indicates that a pin is a branch point;

determining a direction of a route search depending on each flag which is set with respect to each pin;

obtaining a branch point of a clock route, based on all combinations of clock routes from a pin supplied with a clock to pins having timing restrictions set thereto or sequential circuit cells located on both ends of a data path;

calculating a clock skew with respect to a combinations of routes from the branch point which is obtained to the pins having the timing restrictions se thereto or the sequential circuit cells located on both ends of the data path; and evaluating the calculated clock skew.

19. A computer-readable storage medium which stores a program for causing a computer to carry out a route search for use in circuit design, by:

setting with respect to each pin, a corresponding flag of a pass flag which indicates that a pin is passed, a searching flag which indicates that a pin is being searched, and a branch flag which indicates that a pin is a branch point;

determining a direction of a route search depending on each flag which is set with respect to each pin; and when calculating a clock skew between pins having timing restrictions set thereto or sequential circuit cells on sending and receiving ends of a data path, and if a frequency dividing circuit, a PLL circuit or the like exists between a branch point of a clock path and the pins having the timing restrictions set thereto or the sequential circuit cells on the sending and receiving ends, using delay information which is consecutively calculated from a pin which supplies a clock to the circuit and the pins having the timing restrictions set thereto or the sequential circuit cells, so as to calculate a clock skew and a delay of the clock path from the branch point to the pins having the timing restrictions set thereto or the sequential circuit cells on both ends of the data path.

20. A computer-readable storage medium which stores a program for causing a computer to carry out a route search for use in circuit design, by:

setting with respect to each pin, a corresponding flag of a pass flag which indicates that a pin is passed, a searching flag which indicates that a pin is being searched, and a branch flag which indicates that a pin is a branch point;

determining a direction of a route search depending on each flag which is set with respect to each pin; and calculating a delay from a branch point to a pin having timing restrictions set thereto or a sequential circuit cell without taking into consideration effects of a PLL circuit when the branch point is located on a downstream side of the PLL circuit in a direction of the route search, and calculating the delay by taking into consideration effects of a feedback loop of the PLL circuit when the branch point is located closer to a clock supply source than the PLL circuit.

21. A computer-readable storage medium which stores a program for causing a computer to carry out a route search for use in circuit design, by:

setting with respect to each pin, a corresponding flag of a pass flag which indicates that a pin is passed, a searching flag which indicates that a pin is being searched, and a branch flag which indicates that a pin is a branch point;

determining a direction of a route search depending on each flag which is set with respect to each pin; and obtaining a slack for each route based on a result of a timing check, and setting the slack which is obtained with respect to points on the route.

* * * * *